United States Patent
Kanbara et al.

(10) Patent No.: US 12,014,924 B2
(45) Date of Patent: Jun. 18, 2024

(54) SILICON CARBIDE EPITAXIAL SUBSTRATE AND METHOD FOR MANUFACTURING SILICON CARBIDE SEMICONDUCTOR DEVICE

(71) Applicant: SUMITOMO ELECTRIC INDUSTRIES, LTD., Osaka (JP)

(72) Inventors: Kenji Kanbara, Osaka (JP); Hironori Itoh, Osaka (JP); Tsutomu Hori, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 709 days.

(21) Appl. No.: 17/258,967

(22) PCT Filed: Jun. 14, 2019

(86) PCT No.: PCT/JP2019/023624
§ 371 (c)(1),
(2) Date: Jan. 8, 2021

(87) PCT Pub. No.: WO2020/017208
PCT Pub. Date: Jan. 23, 2020

(65) Prior Publication Data
US 2021/0320005 A1    Oct. 14, 2021

(30) Foreign Application Priority Data
Jul. 20, 2018 (JP) .................. 2018-136684

(51) Int. Cl.
*H01L 29/36* (2006.01)
*C30B 29/36* (2006.01)
(Continued)

(52) U.S. Cl.
CPC ........ *H01L 21/02529* (2013.01); *C30B 29/36* (2013.01); *H01L 21/02378* (2013.01);
(Continued)

(58) Field of Classification Search
CPC ............... H01L 29/1608; H01L 29/34; H01L 29/66068; H01L 29/7802; H01L 29/045; C30B 29/36
See application file for complete search history.

(56) References Cited

U.S. PATENT DOCUMENTS 9,716,006 B2 * 7/2017 Hamada .............. H01L 29/7395
9,896,781 B2 * 2/2018 Honke .................. B24B 37/042
(Continued)

FOREIGN PATENT DOCUMENTS

JP      11-060390 A      3/1999
JP      2006-018767 A    1/2006
(Continued)

OTHER PUBLICATIONS

International Search Report for corresponding Application No. PCT/JP2019/023624, dated Sep. 17, 2019.

*Primary Examiner* — Ida M Soward
(74) *Attorney, Agent, or Firm* — Renner, Otto, Boisselle & Sklar, LLP

(57) ABSTRACT

When a value obtained by dividing the number of the one or more second regions by a total of the number of the one or more first regions and the number of the one or more second regions is defined as a first defect free area ratio, a value obtained by dividing the number of the one or more fourth regions by a total of the number of the one or more third regions and the number of the one or more fourth regions is defined as a second defect free area ratio, and a value obtained by dividing the number of the one or more macroscopic defects by an area of the central region is defined as X cm$^{-2}$, A is smaller than B, B is less than or equal to 4, X is more than 0 and less than 4, and a Formula 1 is satisfied.

11 Claims, 28 Drawing Sheets

(51) Int. Cl.
  *H01L 21/02* (2006.01)
  *H01L 21/04* (2006.01)
  *H01L 21/78* (2006.01)
  *H01L 29/16* (2006.01)
  *H01L 29/34* (2006.01)
  *H01L 29/66* (2006.01)
  *H01L 29/78* (2006.01)

(52) U.S. Cl.
  CPC ............ *H01L 21/046* (2013.01); *H01L 21/78* (2013.01); *H01L 29/1608* (2013.01); *H01L 29/34* (2013.01); *H01L 29/66068* (2013.01); *H01L 29/7802* (2013.01)

(56) References Cited

U.S. PATENT DOCUMENTS

| | | | | |
|---|---|---|---|---|
| 10,774,444 | B2* | 9/2020 | Muto | H01L 21/02529 |
| 11,530,491 | B2* | 12/2022 | Wada | C30B 29/36 |
| 2010/0295059 | A1* | 11/2010 | Fujimoto | H01L 21/02631 |
| | | | | 257/77 |
| 2011/0006309 | A1 | 1/2011 | Momose | |
| 2013/0056752 | A1* | 3/2013 | Fujiwara | H01L 29/7802 |
| | | | | 257/77 |
| 2015/0162187 | A1 | 6/2015 | Miyasaka | |
| 2016/0020156 | A1* | 1/2016 | Yamada | H01L 29/78 |
| | | | | 438/14 |
| 2017/0275779 | A1* | 9/2017 | Nishiguchi | C30B 29/36 |
| 2018/0277635 | A1* | 9/2018 | Wada | H01L 29/66068 |
| 2018/0363166 | A1* | 12/2018 | Wada | C23C 16/325 |
| 2018/0371641 | A1* | 12/2018 | Muto | H01L 21/02378 |
| 2019/0013198 | A1 | 1/2019 | Itoh | |
| 2019/0316273 | A1* | 10/2019 | Ishibashi | H01L 21/02579 |

FOREIGN PATENT DOCUMENTS

| | | | | |
|---|---|---|---|---|
| JP | 2013-216554 A | | 10/2013 | |
| JP | 2014-001108 A | | 1/2014 | |
| JP | 2014-019596 A | | 2/2014 | |
| JP | 2016-183087 A | | 10/2016 | |
| JP | 2017-011102 A | | 1/2017 | |
| JP | 2018039731 A | * | 3/2018 | ............ B24B 37/042 |
| WO | 2009/035095 A1 | | 3/2009 | |
| WO | 2017/138247 A1 | | 8/2017 | |
| WO | 2017/141486 A1 | | 8/2017 | |

* cited by examiner

SILICON CARBIDE EPITAXIAL SUBSTRATE AND METHOD FOR MANUFACTURING SILICON CARBIDE SEMICONDUCTOR DEVICE

TECHNICAL FIELD

The present disclosure relates to a silicon carbide epitaxial substrate and a method for manufacturing a silicon carbide semiconductor device. The present application claims a priority based on Japanese Patent Application No. 2018-136684 filed on Jul. 20, 2018, the entire content of which is incorporated herein by reference.

BACKGROUND ART

WO 2009/035095 (PTL 1) discloses a silicon carbide single crystal substrate in which the dislocation array density of threading edge dislocation arrays is less than or equal to $10/cm^2$.

CITATION LIST

Patent Literature

PTL 1: WO 2009/035095

SUMMARY OF INVENTION

A silicon carbide epitaxial substrate according to the present disclosure includes: a silicon carbide substrate; and a silicon carbide epitaxial film located on the silicon carbide substrate. A main front surface of the silicon carbide epitaxial film includes an outer edge, an outer peripheral region located within 3 mm from the outer edge, and a central region surrounded by the outer peripheral region. A maximum diameter of the main front surface is more than or equal to 150 mm. The central region has one or more macroscopic defects. When the central region is divided into a plurality of first square regions each having an area of A $cm^2$, the plurality of first square regions have one or more first regions having the one or more macroscopic defects and one or more second regions not having the one or more macroscopic defects. When the central region is divided into a plurality of second square regions each having an area of B $cm^2$, the plurality of second square regions have one or more third regions having the one or more macroscopic defects and one or more fourth regions not having the one or more macroscopic defects. When a value obtained by dividing the number of the one or more second regions by a total of the number of the one or more first regions and the number of the one or more second regions is defined as a first defect free area ratio, a value obtained by dividing the number of the one or more fourth regions by a total of the number of the one or more third regions and the number of the one or more fourth regions is defined as a second defect free area ratio, and a value obtained by dividing the number of the one or more macroscopic defects by an area of the central region is defined as X $cm^{-2}$, A is smaller than B, B is less than or equal to 4, X is more than 0 and less than 4, and a Formula 1 is satisfied:

$$e^{(A \cdot B)X} < \frac{\text{Second Defect Free Area Ratio}}{\text{First Defect Free Area Ratio}} < 1. \quad \text{(Formula 1)}$$

A silicon carbide epitaxial substrate according to the present disclosure includes: a silicon carbide substrate; and a silicon carbide epitaxial film located on the silicon carbide substrate. A polytype of silicon carbide of each of the silicon carbide substrate and the silicon carbide epitaxial film is 4H. Each of the silicon carbide substrate and the silicon carbide epitaxial film includes an n type impurity. A main front surface of the silicon carbide epitaxial film includes an outer edge, an outer peripheral region located within 3 mm from the outer edge, and a central region surrounded by the outer peripheral region. A maximum diameter of the main front surface is more than or equal to 150 mm. The central region has one or more macroscopic defects. When the central region is divided into a plurality of first square regions each having an area of A $cm^2$, the plurality of first square regions have one or more first regions having the one or more macroscopic defects and one or more second regions not having the one or more macroscopic defects. When the central region is divided into a plurality of second square regions each having an area of B $cm^2$, the plurality of second square regions have one or more third regions having the one or more macroscopic defects and one or more fourth regions not having the one or more macroscopic defects. When a value obtained by dividing the number of the one or more second regions by a total of the number of the one or more first regions and the number of the one or more second regions is defined as a first defect free area ratio, a value obtained by dividing the number of the one or more fourth regions by a total of the number of the one or more third regions and the number of the one or more fourth regions is defined as a second defect free area ratio, and a value obtained by dividing the number of the one or more macroscopic defects by an area of the central region is defined as X $cm^{-2}$, A is 0.04, B is 0.25, X is more than 0 and less than 4, and a Formula 1 is satisfied.

DETAILED DESCRIPTION

[Description of Embodiments]

Figure 1:
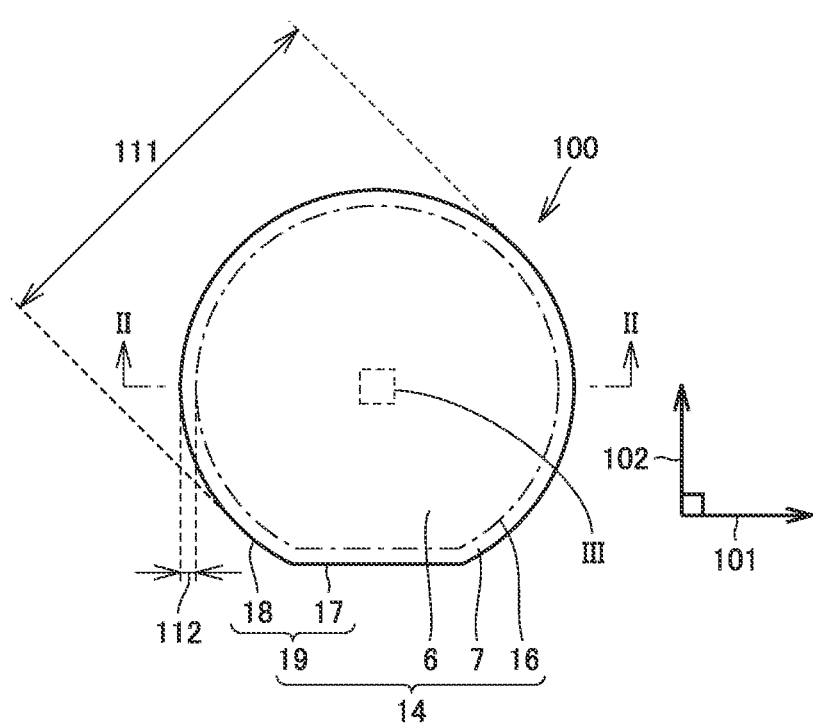
FIG. 1 is a schematic plan view showing a configuration of a silicon carbide epitaxial substrate according to the present embodiment.

First, the following describes a summary of an embodiment of the present disclosure. Regarding crystallographic indications in the present specification, an individual orientation is represented by [ ], a group orientation is represented by < >, and an individual plane is represented by ( ), and a group plane is represented by { }. A crystallographically negative index is normally expressed by putting "-" (bar) above a numeral; however, in the present specification, the crystallographically negative index is expressed by putting a negative sign before the numeral.

(1) A silicon carbide epitaxial substrate 100 according to the present disclosure includes: a silicon carbide substrate 10; and a silicon carbide epitaxial film 20 located on silicon carbide substrate 10. A main front surface 14 of silicon carbide epitaxial film 20 includes an outer edge 19, an outer peripheral region 7 located within 3 mm from outer edge 19, and a central region 6 surrounded by outer peripheral region 7. A maximum diameter of main front surface 14 is more than or equal to 150 mm. Central region 6 has one or more macroscopic defects 3. When central region 6 is divided into a plurality of first square regions 50 each having an area of A cm$^2$, the plurality of first square regions 50 have one or more first regions 51 having one or more macroscopic defects 3 and one or more second regions 52 not having one or more macroscopic defects 3. When central region 6 is divided into a plurality of second square regions 60 each having an area of B cm$^2$, the plurality of second square regions 60 have one or more third regions 61 having one or more macroscopic defects 3 and one or more fourth regions 62 not having one or more macroscopic defects 3. When a value obtained by dividing the number of one or more second regions 52 by a total of the number of one or more first regions 51 and the number of one or more second regions 52 is defined as a first defect free area ratio, a value obtained by dividing the number of one or more fourth regions 62 by a total of the number of one or more third regions 61 and the number of one or more fourth regions 62 is defined as a second defect free area ratio, and a value obtained by dividing the number of one or more macroscopic defects 3 by an area of central region 6 is defined as X cm$^{-2}$, A is smaller than B, B is less than or equal to 4, X is more than 0 and less than 4, and a Formula 1 is satisfied.

(2) In silicon carbide epitaxial substrate 100 according to (1), B may be less than or equal to 2.

(3) In silicon carbide epitaxial substrate 100 according to (1), B may be less than or equal to 0.5.

(4) In silicon carbide epitaxial substrate 100 according to (1), B may be less than or equal to 0.25.

(5) In silicon carbide epitaxial substrate 100 according to (1), A may be more than or equal to 0.01.

(6) In silicon carbide epitaxial substrate 100 according to (1), A may be more than or equal to 0.04.

(7) In silicon carbide epitaxial substrate 100 according to (1), A may be 0.04 and B may be 0.25.

(8) In silicon carbide epitaxial substrate 100 according to any one of (1) to (7), a polytype of silicon carbide of each of silicon carbide substrate 10 and silicon carbide epitaxial film 20 may be 4H.

(9) In silicon carbide epitaxial substrate 100 according to any one of (1) to (8), each of silicon carbide substrate 10 and silicon carbide epitaxial film 20 may include an n type impurity.

(10) A silicon carbide epitaxial substrate 100 according to the present disclosure includes: a silicon carbide substrate 10; and a silicon carbide epitaxial film 20 located on silicon carbide substrate 10. A polytype of silicon carbide of each of silicon carbide substrate 10 and silicon carbide epitaxial film 20 is 4H. Each of silicon carbide substrate 10 and silicon carbide epitaxial film 20 includes an n type impurity. A main front surface 14 of silicon carbide epitaxial film 20 includes an outer edge 19, an outer peripheral region 7 located within 3 mm from outer edge 19, and a central region 6 surrounded by outer peripheral region 7. A maximum diameter of main front surface 14 is more than or equal to 150 mm. Central region 6 has one or more macroscopic defects 3. When central region 6 is divided into a plurality of first square regions 50 each having an area of A cm², the plurality of first square regions 50 have one or more first regions 51 having one or more macroscopic defects 3 and one or more second regions 52 not having one or more macroscopic defects 3. When central region 6 is divided into a plurality of second square regions 60 each having an area of B cm², the plurality of second square regions 60 have one or more third regions 61 having one or more macroscopic defects 3 and one or more fourth regions 62 not having one or more macroscopic defects 3. When a value obtained by dividing the number of one or more second regions 52 by a total of the number of one or more first regions 51 and the number of one or more second regions 52 is defined as a first defect free area ratio, a value obtained by dividing the number of one or more fourth regions 62 by a total of the number of one or more third regions 61 and the number of one or more fourth regions 62 is defined as a second defect free area ratio, and a value obtained by dividing the number of one or more macroscopic defects 3 by an area of central region 6 is defined as X cm⁻², A is 0.04, B is 0.25, X is more than 0 and less than 4, and a Formula 1 is satisfied.

(11) A method for manufacturing a silicon carbide semiconductor device according to the present disclosure includes: preparing silicon carbide epitaxial substrate 100 recited in any one of (1) to (10); and processing silicon carbide epitaxial substrate 100.

[Details of Embodiments of the Present Disclosure]

Hereinafter, details of embodiments of the present disclosure will be described. In the following description, the same or corresponding elements are denoted by the same reference characters, and will not be described repeatedly.

(Silicon Carbide Epitaxial Substrate)

Figure 2:
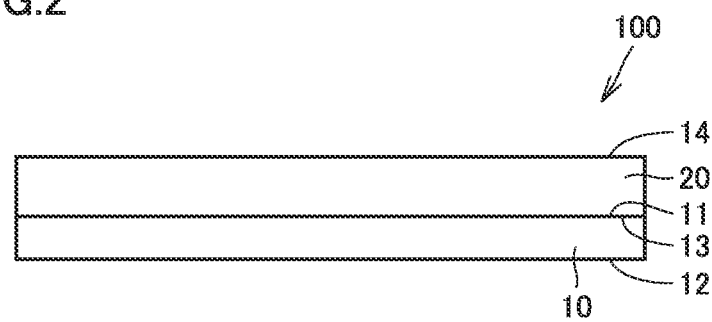
FIG. 2 is a schematic cross sectional view taken along a line II-II of FIG. 1.

FIG. 1 is a schematic plan view showing a configuration of a silicon carbide epitaxial substrate 100 according to the present embodiment. FIG. 2 is a schematic cross sectional view taken along a line II-II of FIG. 1. As shown in FIGS. 1 and 2, silicon carbide epitaxial substrate 100 according to the present embodiment includes a silicon carbide substrate 10 and a silicon carbide epitaxial film 20. Silicon carbide epitaxial film 20 is located on silicon carbide substrate 10. Silicon carbide substrate 10 has a first main surface 11 and a second main surface 12. Second main surface 12 is located opposite to first main surface 11. Silicon carbide epitaxial film 20 has a main front surface 14 and a third main surface 13. Third main surface 13 is in contact with first main surface 11. The polytype of silicon carbide of each of silicon carbide substrate 10 and silicon carbide epitaxial film 20 is, for example, 4H.

As shown in FIG. 1, main front surface 14 expands two-dimensionally along each of a first direction 101 and a second direction 102. Main front surface 14 of silicon carbide epitaxial film 20 includes an outer edge 19, an outer peripheral region 7, and a central region 6. Outer peripheral region 7 is a region within 3 mm from outer edge 19. From a different point of view, it can be said that a distance 112 from outer edge 19 to a boundary 16 between outer peripheral region 7 and central region 6 is 3 mm in a direction perpendicular to the tangent of outer edge 19. Central region 6 is a region surrounded by outer peripheral region 7.

From a different point of view, it can be said that main front surface 14 is constituted of outer edge 19, outer peripheral region 7, and central region 6. Central region 6 includes the center of main front surface 14. Outer edge 19 includes, for example, an orientation flat 17 and an arc-shaped portion 18. Orientation flat 17 extends along first direction 101. Arc-shaped portion 18 is continuous to orientation flat 17.

Second direction 102 is, for example, a <1-100> direction. Second direction 102 may be, for example, a [1-100] direction. First direction 101 is parallel to main front surface 14 and is perpendicular to second direction 102. First direction 101 is an off direction. First direction 101 is a direction including a <11-20> direction component, for example. From a different point of view, it can be said that the first direction is a direction obtained by projecting the <11-20> direction onto a plane parallel to main front surface 14. First direction 101 may be a direction including a [11-20] direction component, for example. As shown in FIG. 1, a maximum diameter 111 (diameter) of main front surface 14 is, for example, 150 mm. Maximum diameter 111 may be 200 mm or may be 250 mm. The upper limit of maximum diameter 111 may be 300 mm, for example. Maximum diameter 111 may be more than or equal to 150 mm and less than or equal to 200 mm, may be more than or equal to 150 mm and less than or equal to 250 mm, or may be more than or equal to 150 mm and less than or equal to 300 mm.

Figure 3:
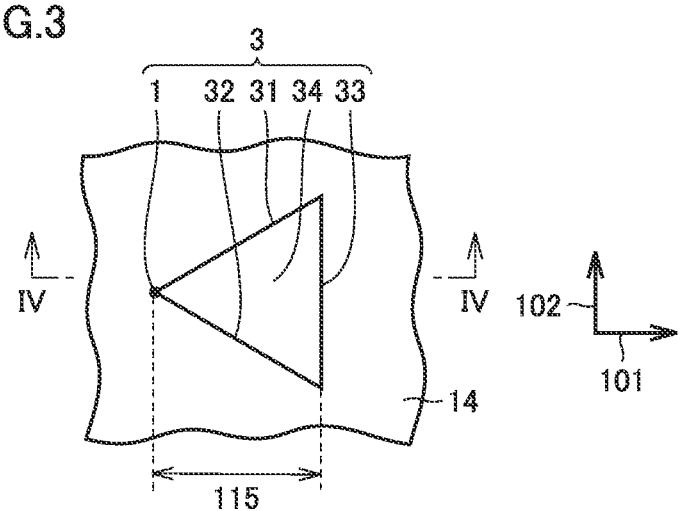
FIG. 3 is an enlarged schematic plan view of a region III in FIG. 1.
Figure 4:
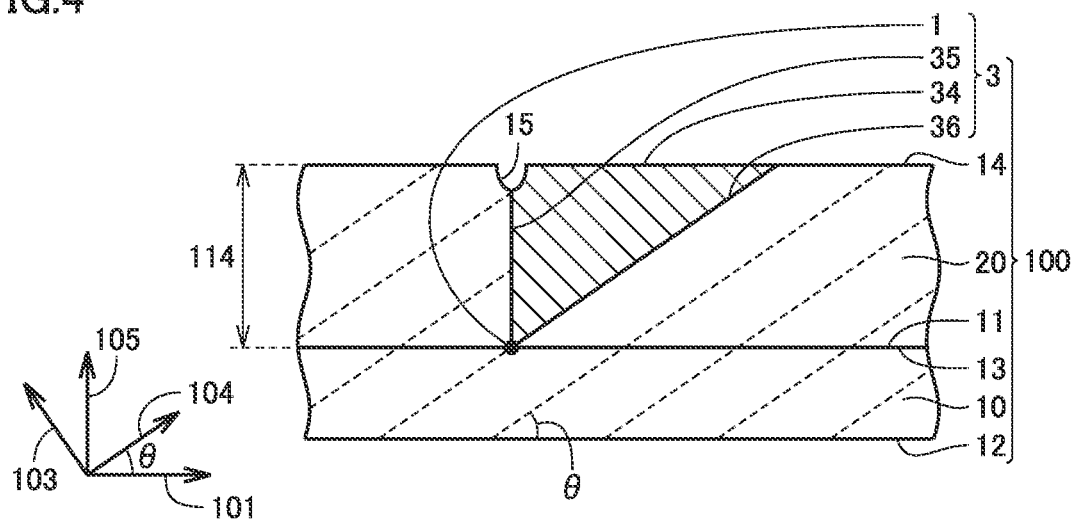
FIG. 4 is a schematic cross sectional view taken along a line IV-IV of FIG. 3.

FIG. 3 is an enlarged schematic plan view of a region III in FIG. 1. FIG. 4 is a schematic cross sectional view taken along a line IV-IV of FIG. 3.

As shown in FIG. 3, central region 6 has a macroscopic defect 3. As shown in FIG. 3, when viewed in a direction perpendicular to main front surface 14, macroscopic defect 3 has a triangular shape, for example. Macroscopic defect 3 is, for example, a downfall defect, a triangular defect, or a carrot defect. Macroscopic defect 3 includes, for example, silicon carbide having a polytype different from the polytype of silicon carbide of silicon carbide epitaxial film 20. The polytype of the silicon carbide of silicon carbide epitaxial film 20 is, for example, 4H. The polytype of the silicon carbide of macroscopic defect 3 is, for example, 3C. The polytype of the silicon carbide of macroscopic defect 3 is not limited to 3C as long as the polytype of the silicon carbide of macroscopic defect 3 is different from the polytype of the silicon carbide of silicon carbide epitaxial film 20. The polytype of the silicon carbide of macroscopic defect 3 may be, for example, 6H or the like.

As shown in FIG. 3, macroscopic defect 3 has a first portion 34, a second portion 33, a first side portion 31, a second side portion 32, and a starting point 1. As shown in FIG. 3, when viewed in the direction perpendicular to main front surface 14, first portion 34 is a region expanding in first direction 101 from starting point 1 located at a boundary between silicon carbide substrate 10 and silicon carbide epitaxial film 20. First portion 34 is located between first side portion 31 and second side portion 32. An angle between first side portion 31 and second side portion 32 is, for example, more than or equal to 450 and less than or equal to 135°.

As shown in FIG. 3, each of first side portion 31 and second side portion 32 is inclined with respect to first direction 101. The inclination direction of first side portion 31 with respect to first direction 101 is opposite to the inclination direction of second side portion 32 with respect to first direction 101. Each of first side portion 31 and second side portion 32 is continuous to starting point 1. As shown in FIG. 3, when viewed in the direction perpendicular to main front surface 14, an interval between first side portion 31 and second side portion 32 along second direction 102 becomes wider in first direction 101.

As shown in FIG. 3, second portion 33 extends along second direction 102 when viewed in the direction perpendicular to main front surface 14. Second portion 33 is continuous to each of first side portion 31 and second side portion 32. Second portion 33 may be continuous to main front surface 14. As shown in FIG. 3, when viewed in the direction perpendicular to main front surface 14, a region surrounded by first side portion 31, second side portion 32, and second portion 33 is in the form of a triangle, for example.

As shown in FIG. 4, macroscopic defect 3 is in contact with silicon carbide epitaxial film 20. Macroscopic defect 3 is located on silicon carbide substrate 10. A plane indicated by each of broken lines in FIG. 4 is a {0001} plane. From a different point of view, it can be said that the plane indicated by the broken line is a basal plane. A third direction 103 is a direction perpendicular to the {0001} plane. Third direction 103 is, for example, a <0001> direction. Third direction 103 may be, for example, a [0001] direction. A fourth direction 104 is a direction perpendicular to third direction 103. Fourth direction 104 is, for example, a <11-20> direction. Fourth direction 104 may be, for example, a [11-20] direction. Fourth direction 104 is, for example, an off direction. The normal direction of main front surface 14 is a fifth direction 105. The fifth direction is, for example, a direction inclined by an off angle θ in the off direction with respect to the [0001] direction.

As shown in FIG. 4, macroscopic defect 3 further includes an inclined portion 36 and a side portion 35. Inclined portion 36 extends along the basal plane. Inclined portion 36 may be continuous to starting point 1. Inclined portion 36 may be continuous to main front surface 14. Inclined portion 36 is in contact with silicon carbide epitaxial film 20. Side portion 35 extends along a direction substantially perpendicular to main front surface 14. Side portion 35 extends in a direction intersecting inclined portion 36. Side portion 35 may be continuous to starting point 1.

As shown in FIG. 4, a particle may exist at starting point 1. The particle is, for example, a downfall in the form of a particle, the downfall being obtained by a deposit in a growth apparatus falling on a surface of silicon carbide substrate 10. Specifically, the particle is a silicon carbide particle or a carbon particle. The diameter of the particle is, for example, more than or equal to 1 μm and less than or equal to 1 mm. When the particle is composed of silicon carbide, the polytype of the silicon carbide of the particle may be different from the polytype of the silicon carbide of silicon carbide epitaxial film 20.

As shown in FIG. 4, a recess 15 may be formed above starting point 1. Recess 15 may be continuous to side portion 35 of macroscopic defect 3. Each of recess 15 and starting point 1 may be located on a straight line perpendicular to main front surface 14. Recess 15 is opened on the main front surface 14 side. As shown in FIG. 4, thickness 114 of silicon carbide epitaxial film 20 is, for example, more than or equal to 15 μm. Thickness 114 of silicon carbide epitaxial film 20 may be, for example, more than or equal to 20 μm or may be more than or equal to 30 μm. Assuming that thickness 114 of silicon carbide epitaxial film 20 is represented by T and the tangent of off angle θ is represented by tan(θ), length 115 of macroscopic defect 3 in first direction 101 is about T/tan(θ).

Figure 5:
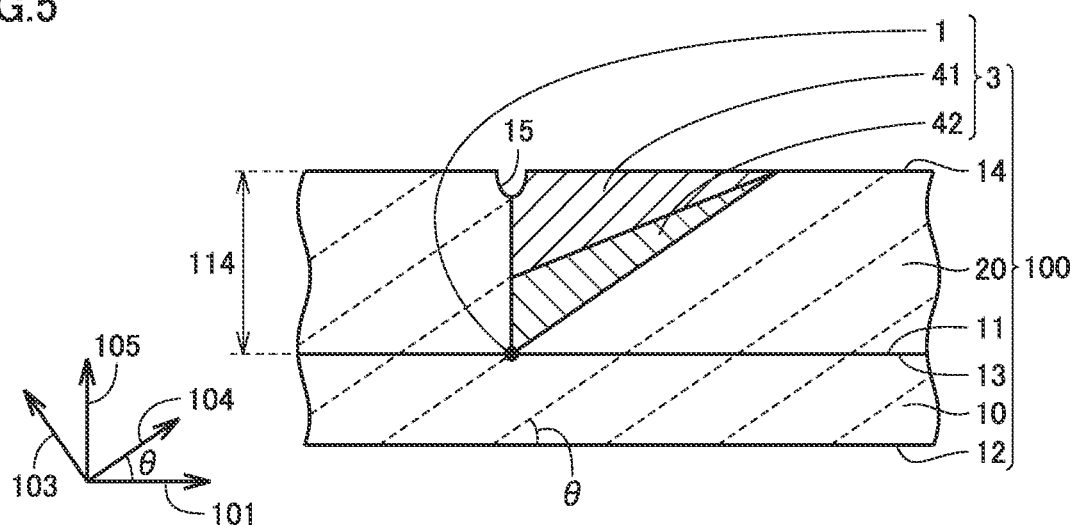
FIG. 5 is a schematic cross sectional view showing a configuration of a silicon carbide epitaxial substrate according to a first modification of the present embodiment.

FIG. 5 is a schematic cross sectional view showing a configuration of a silicon carbide epitaxial substrate according to a first modification of the present embodiment. As shown in FIG. 5, macroscopic defect 3 may have a third portion 41 and a fourth portion 42. Third portion 41 is located on fourth portion 42. Third portion 41 is exposed on main front surface 14. Fourth portion 42 has a portion along the basal plane. The polytype of silicon carbide of fourth portion 42 may be different from the polytype of silicon carbide of third portion 41. The polytype of the silicon carbide of fourth portion 42 may be, for example, 3C. The polytype of the silicon carbide of third portion 41 may be, for example, 4H.

Silicon carbide substrate 10 is composed of, for example, a silicon carbide single crystal. Silicon carbide substrate 10 includes an n type impurity such as nitrogen (N), for example. The conductivity type of silicon carbide substrate 10 is, for example, n type. First main surface 11 is a surface inclined at an off angle of more than or equal to 2° and less than or equal to 6° with respect to the {0001} plane. When first main surface 11 is inclined with respect to the {0001} plane, the inclination direction of first main surface 11 is, for example, the <11-20> direction. The thickness of silicon carbide substrate 10 is, for example, more than or equal to 350 μm and less than or equal to 500 sm.

Silicon carbide epitaxial film 20 includes an n type impurity such as nitrogen, for example. The conductivity type of silicon carbide epitaxial film 20 is, for example, n type. The concentration of the n type impurity included in silicon carbide epitaxial film 20 may be lower than the concentration of the n type impurity included in silicon carbide substrate 10. Each of the concentrations of the n type impurities is measured by, for example, a mercury probe type C (capacitance)-V (voltage) measuring apparatus. The area of the probe is, for example, 0.005 cm².

Main front surface 14 of silicon carbide epitaxial film 20 is a surface inclined at an off angle θ of more than or equal to 2° and less than or equal to 6° with respect to the {0001} plane. Specifically, main front surface 14 is a surface inclined at an off angle θ of more than or equal to 2° and less than or equal to 6° with respect to the (0001) plane. Main front surface 14 may be a surface inclined at an off angle θ2 of more than or equal to 2° and less than or equal to 6° with respect to a (000-1) plane. The off direction is, for example, the <11-20> direction. It should be noted that the off direction is not limited to the <11-20> direction. The off direction may be a <1-100> direction or may be a direction having a <1-100> direction component and a <11-20> direction component, for example. Off angle θ is an angle at which main front surface 14 is inclined with respect to the (0001) plane. Off angle θ may be more than or equal to 3°. Off angle θ may be less than or equal to 5°.

Figure 6:
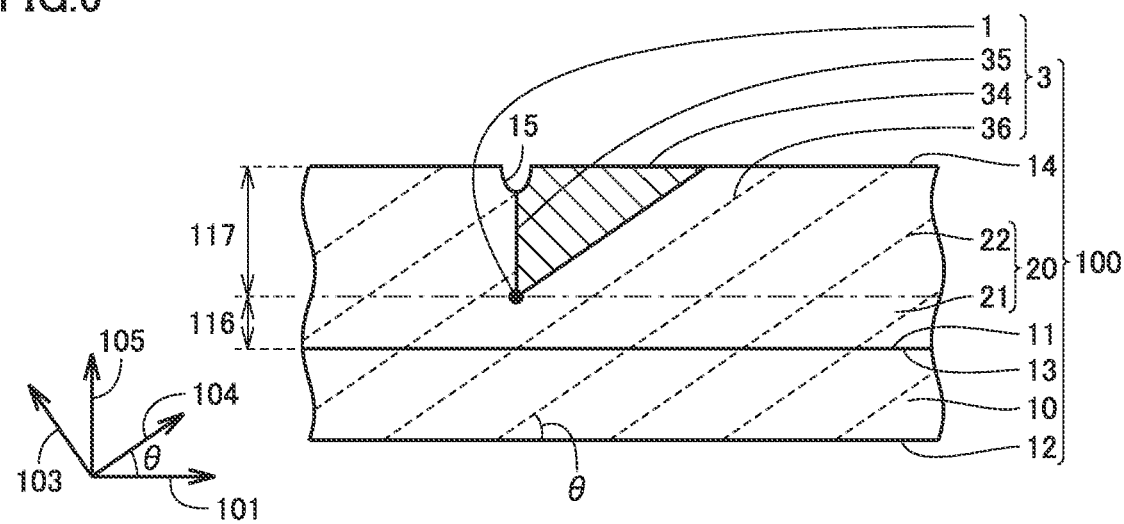
FIG. 6 is a schematic cross sectional view showing a configuration of a silicon carbide epitaxial substrate according to a second modification of the present embodiment.

FIG. 6 is a schematic cross sectional view showing a configuration of a silicon carbide epitaxial substrate according to a second modification of the present embodiment. As shown in FIG. 6, silicon carbide epitaxial film 20 may include a first epitaxial film 21 and a second epitaxial film 22. Starting point 1 may be located on first epitaxial film 21. From a different point of view, it can be said that starting point 1 may be separated from silicon carbide substrate 10. From a further different point of view, it can be said that starting point 1 may be located in silicon carbide epitaxial film 20. Starting point 1 may be located at a boundary between first epitaxial film 21 and second epitaxial film 22.

The thickness of first epitaxial film 21 (first thickness 116) may be smaller than the thickness of second epitaxial film 22 (second thickness 117). That is, starting point 1 may be located in a region on the first main surface 11 side with respect to a location at the half of the thickness of silicon carbide epitaxial film 20.

Figure 7:
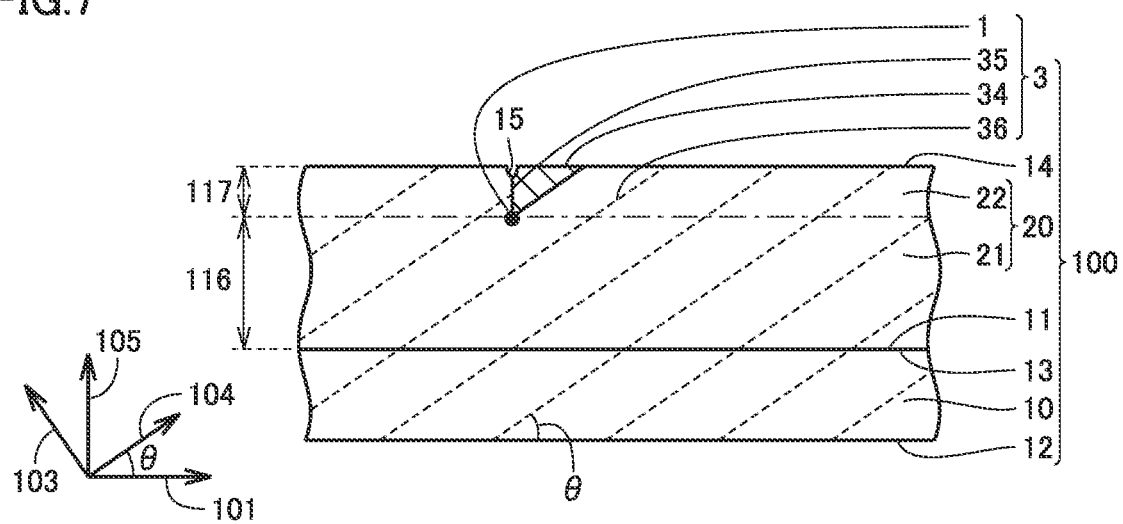
FIG. 7 is a schematic cross sectional view showing a configuration of a silicon carbide epitaxial substrate according to a third modification of the present embodiment.

FIG. 7 is a schematic cross sectional view showing a configuration of a silicon carbide epitaxial substrate according to a third modification of the present embodiment. As shown in FIG. 7, silicon carbide epitaxial film 20 may include a first epitaxial film 21 and a second epitaxial film 22. The thickness of first epitaxial film 21 (first thickness 116) may be larger than the thickness of second epitaxial film 22 (second thickness 117). That is, starting point 1 may be located in a region on the main front surface 14 side with respect to a location at the half of the thickness of silicon carbide epitaxial film 20.

Figure 8:
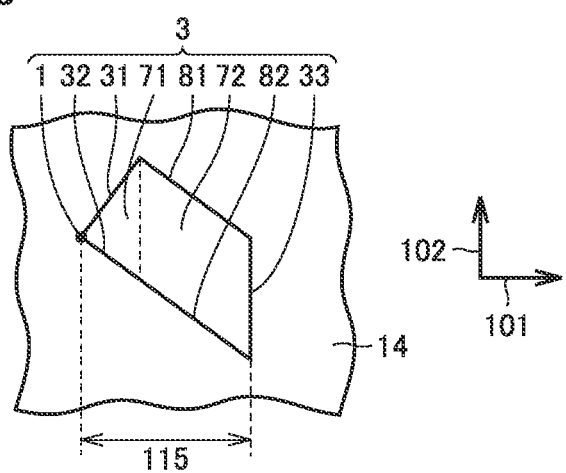
FIG. 8 is an enlarged schematic plan view showing a configuration of a silicon carbide epitaxial substrate according to a fourth modification of the present embodiment.

FIG. 8 is an enlarged schematic plan view showing a configuration of a silicon carbide epitaxial substrate according to a fourth modification of the present embodiment. As shown in FIG. 8, a macroscopic defect 3 may include a starting point 1, a first defect region 71, a second defect region 72, a second portion 33, a first side portion 31, a second side portion 32, a third side portion 81, and a fourth side portion 82. As shown in FIG. 8, when viewed in the direction perpendicular to main front surface 14, first defect region 71 is a region expanding from starting point 1 in first direction 101. First defect region 71 is located between first side portion 31 and second side portion 32. Each of first side portion 31 and second side portion 32 is inclined with respect to first direction 101. The inclination direction of first side portion 31 with respect to first direction 101 is opposite to the inclination direction of second side portion 32 with respect to first direction 101. Each of first side portion 31 and second side portion 32 is continuous to starting point 1.

Second defect region 72 is continuous to first defect region 71. Second defect region 72 is located between third side portion 81 and fourth side portion 82. Each of third side portion 81 and fourth side portion 82 is inclined with respect to first direction 101. The inclination direction of third side portion 81 with respect to first direction 101 is the same as the inclination direction of fourth side portion 82 with respect to first direction 101. Third side portion 81 is continuous to first side portion 31. Third side portion 81 is inclined with respect to first side portion 31. The inclination direction of first side portion 31 with respect to first direction 101 is opposite to the inclination direction of third side portion 81 with respect to first direction 101.

Fourth side portion 82 is continuous to second side portion 32. Fourth side portion 82 is along second side portion 32. Fourth side portion 82 is parallel to second side portion 32. Fourth side portion 82 may be parallel to third side portion 81. Each of third side portion 81 and fourth side portion 82 is continuous to second portion 33. Second defect region 72 is located between first defect region 71 and second portion 33. As shown in FIG. 8, second portion 33 may extend along second direction 102 when viewed in the direction perpendicular to main front surface 14.

Figure 9:
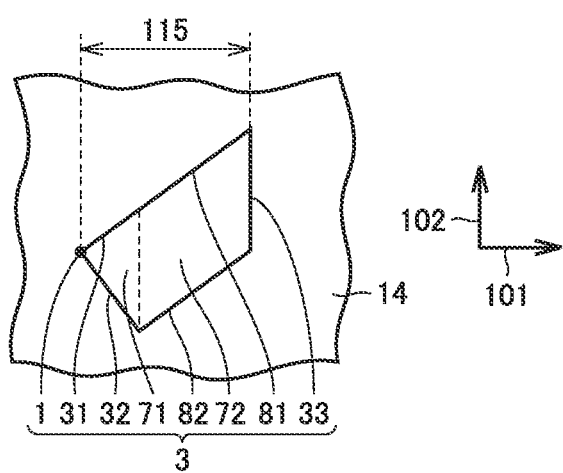
FIG. 9 is an enlarged schematic plan view showing a configuration of a silicon carbide epitaxial substrate according to a fifth modification of the present embodiment.

FIG. 9 is an enlarged schematic plan view showing a configuration of a silicon carbide epitaxial substrate according to a fifth modification of the present embodiment. As shown in FIG. 9, a macroscopic defect 3 may include a starting point 1, a first defect region 71, a second defect region 72, a second portion 33, a first side portion 31, a second side portion 32, a third side portion 81, and a fourth side portion 82. As shown in FIG. 9, when viewed in the direction perpendicular to main front surface 14, first defect region 71 is a region expanding from starting point 1 in first direction 101. First defect region 71 is located between first side portion 31 and second side portion 32. Each of first side portion 31 and second side portion 32 is inclined with respect to first direction 101. The inclination direction of first side portion 31 with respect to first direction 101 is opposite to the inclination direction of second side portion 32 with respect to first direction 101. Each of first side portion 31 and second side portion 32 is continuous to starting point 1.

Second defect region 72 is continuous to first defect region 71. Second defect region 72 is located between third side portion 81 and fourth side portion 82. Each of third side portion 81 and fourth side portion 82 is inclined with respect to first direction 101. The inclination direction of third side portion 81 with respect to first direction 101 is the same as the inclination direction of fourth side portion 82 with respect to first direction 101. Third side portion 81 is continuous to first side portion 31. Third side portion 81 is along first side portion 31. Third side portion 81 is parallel to first side portion 31.

Fourth side portion 82 is continuous to second side portion 32. Fourth side portion 82 is inclined with respect to second side portion 32. The inclination direction of second side portion 32 with respect to first direction 101 is opposite to the inclination direction of fourth side portion 82 with respect to first direction 101. Fourth side portion 82 may be parallel to third side portion 81. Each of third side portion 81 and fourth side portion 82 is continuous to second portion 33. Second defect region 72 is located between first defect region 71 and second portion 33. As shown in FIG. 9, second portion 33 may extend along second direction 102 when viewed in the direction perpendicular to main front surface 14.

Figure 10:
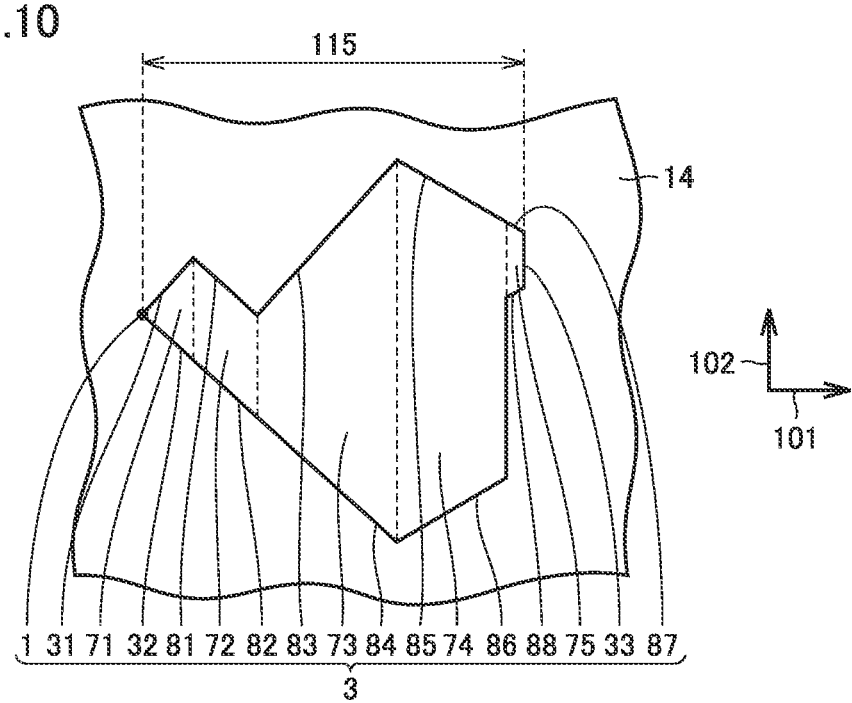
FIG. 10 is an enlarged schematic plan view showing a configuration of a silicon carbide epitaxial substrate according to a sixth modification of the present embodiment.

FIG. 10 is an enlarged schematic plan view showing a configuration of a silicon carbide epitaxial substrate according to a sixth modification of the present embodiment. As shown in FIG. 10, macroscopic defect 3 may include a starting point 1, a first defect region 71, a second defect region 72, a third defect region 73, a fourth defect region 74, a fifth defect region 75, a second portion 33, a first side portion 31, a second side portion 32, a third side portion 81, a fourth side portion 82, a fifth side portion 83, a sixth side portion 84, a seventh side portion 85, an eighth side portion 86, a ninth side portion 87, and a tenth side portion 88.

As shown in FIG. 10, when viewed in the direction perpendicular to main front surface 14, first defect region 71 is a region expanding from starting point 1 in first direction 101. First defect region 71 is located between first side portion 31 and second side portion 32. Each of first side portion 31 and second side portion 32 is inclined with respect to first direction 101. The inclination direction of first side portion 31 with respect to first direction 101 is opposite to the inclination direction of second side portion 32 with respect to first direction 101. Each of first side portion 31 and second side portion 32 is continuous to starting point 1.

Second defect region 72 is continuous to first defect region 71. Second defect region 72 is located between third side portion 81 and fourth side portion 82. Each of third side portion 81 and fourth side portion 82 is inclined with respect to first direction 101. The inclination direction of third side portion 81 with respect to first direction 101 is the same as the inclination direction of fourth side portion 82 with respect to first direction 101. Third side portion 81 is continuous to first side portion 31. Third side portion 81 is inclined with respect to first side portion 31. The inclination direction of first side portion 31 with respect to first direction 101 is opposite to the inclination direction of third side portion 81 with respect to first direction 101. Fourth side portion 82 is continuous to second side portion 32. Fourth side portion 82 is along second side portion 32. Fourth side portion 82 is parallel to second side portion 32. Fourth side portion 82 may be parallel to third side portion 81. Second defect region 72 is located between first defect region 71 and third defect region 73.

Third defect region 73 is continuous to second defect region 72. Third defect region 73 is located between fifth side portion 83 and sixth side portion 84. Each of fifth side portion 83 and sixth side portion 84 is inclined with respect to first direction 101. The inclination direction of fifth side portion 83 with respect to first direction 101 is opposite to the inclination direction of sixth side portion 84 with respect to first direction 101. Fifth side portion 83 is continuous to third side portion 81. Fifth side portion 83 is inclined with respect to third side portion 81. The inclination direction of third side portion 81 with respect to first direction 101 is opposite to the inclination direction of fifth side portion 83 with respect to first direction 101. Sixth side portion 84 is continuous to fourth side portion 82. Sixth side portion 84 is along fourth side portion 82. Sixth side portion 84 is parallel to fourth side portion 82. Sixth side portion 84 is inclined with respect to fifth side portion 83. Third defect region 73 is located between second defect region 72 and fourth defect region 74.

Fourth defect region 74 is continuous to third defect region 73. Fourth defect region 74 is located between seventh side portion 85 and eighth side portion 86. Each of seventh side portion 85 and eighth side portion 86 is inclined with respect to first direction 101. The inclination direction of seventh side portion 85 with respect to first direction 101 is opposite to the inclination direction of eighth side portion 86 with respect to first direction 101. Seventh side portion 85 is continuous to fifth side portion 83. Seventh side portion 85 is inclined with respect to fifth side portion 83. The inclination direction of fifth side portion 83 with respect to first direction 101 is opposite to the inclination direction of seventh side portion 85 with respect to first direction 101. Eighth side portion 86 is continuous to sixth side portion 84. Eighth side portion 86 is inclined with respect to sixth side portion 84. The inclination direction of sixth side portion 84 with respect to first direction 101 is opposite to the inclination direction of eighth side portion 86 with respect to first direction 101. Eighth side portion 86 is inclined with respect to seventh side portion 85. Fourth defect region 74 is located between third defect region 73 and fifth defect region 75.

Fifth defect region 75 is continuous to fourth defect region 74. Fifth defect region 75 is located between ninth side portion 87 and tenth side portion 88. Each of ninth side portion 87 and tenth side portion 88 is inclined with respect to first direction 101. The inclination direction of ninth side portion 87 with respect to first direction 101 is opposite to the inclination direction of tenth side portion 88 with respect to first direction 101. Ninth side portion 87 is continuous to seventh side portion 85. Ninth side portion 87 is along seventh side portion 85. Ninth side portion 87 is parallel to seventh side portion 85. Tenth side portion 88 is separated from eighth side portion 86. Tenth side portion 88 is inclined with respect to ninth side portion 87. Fifth defect region 75 is located between fourth defect region 74 and second portion 33. As shown in FIG. 10, second portion 33 may extend along second direction 102 when viewed in the direction perpendicular to main front surface 14.

(Defect Free Area)

Next, defect free areas will be described.

Figure 11:
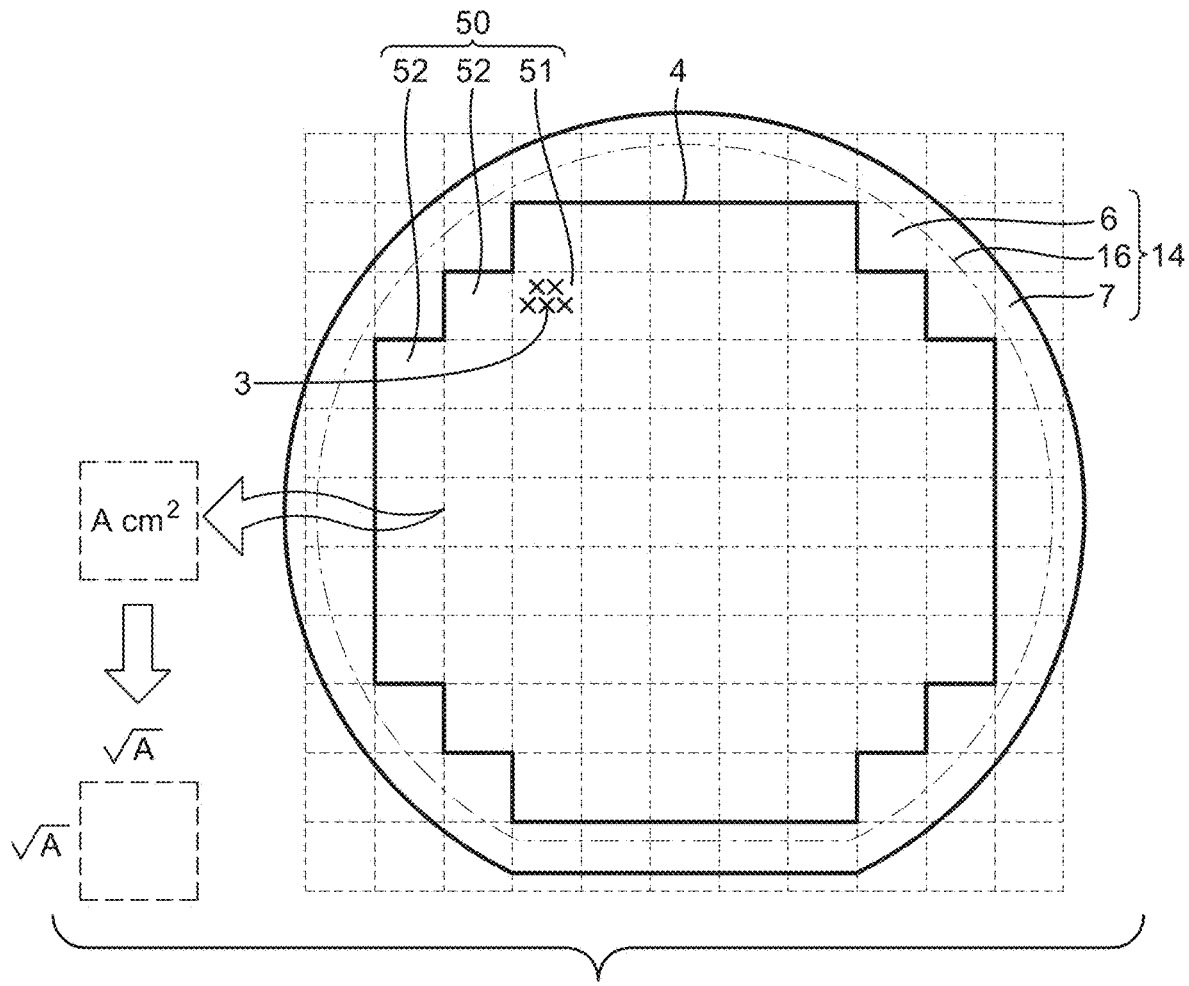
FIG. 11 is a schematic diagram showing a state in which a central region of the silicon carbide epitaxial substrate according to the present embodiment is divided into a plurality of first square regions.

As shown in FIG. 11, central region 6 is divided into a plurality of first square regions 50 each having an area of A $cm^2$. The length of each side of each first square region 50 having an area of A $cm^2$ is the square root of A. For example, the length of each side of a square region having an area of 0.04 $cm^2$ is 0.2 cm. In FIG. 11, the minimum squares indicated by broken lines are first square region 50. The plurality of first square regions 50 include: one or more first regions 51 having one or more macroscopic defects 3, and one or more second regions 52 not having one or more macroscopic defects 3. A value obtained by dividing the number of one or more second regions 52 by the total of the number of one or more first regions 51 and the number of one or more second regions 52 represents a first defect free area ratio.

For example, as shown in FIG. 11, central region 6 of main front surface 14 is divided into 69 square regions. Among the 69 square regions, macroscopic defects 3 exist in one square region, and no macroscopic defects 3 exist in 68 square regions. The square region having macroscopic defects 3 existing therein is a first region 51. The square regions having no macroscopic defects 3 existing therein are second regions 52. The number of one or more first regions 51 is one. The number of one or more second regions 52 is 68. The first defect free area ratio is a value obtained by dividing the number (68) of one or more second regions 52 by the total (69) of the number (1) of one or more first regions 51 and the number (68) of one or more second regions 52. In this case, the first defect free area ratio is 68/69=98.6%.

Figure 12:
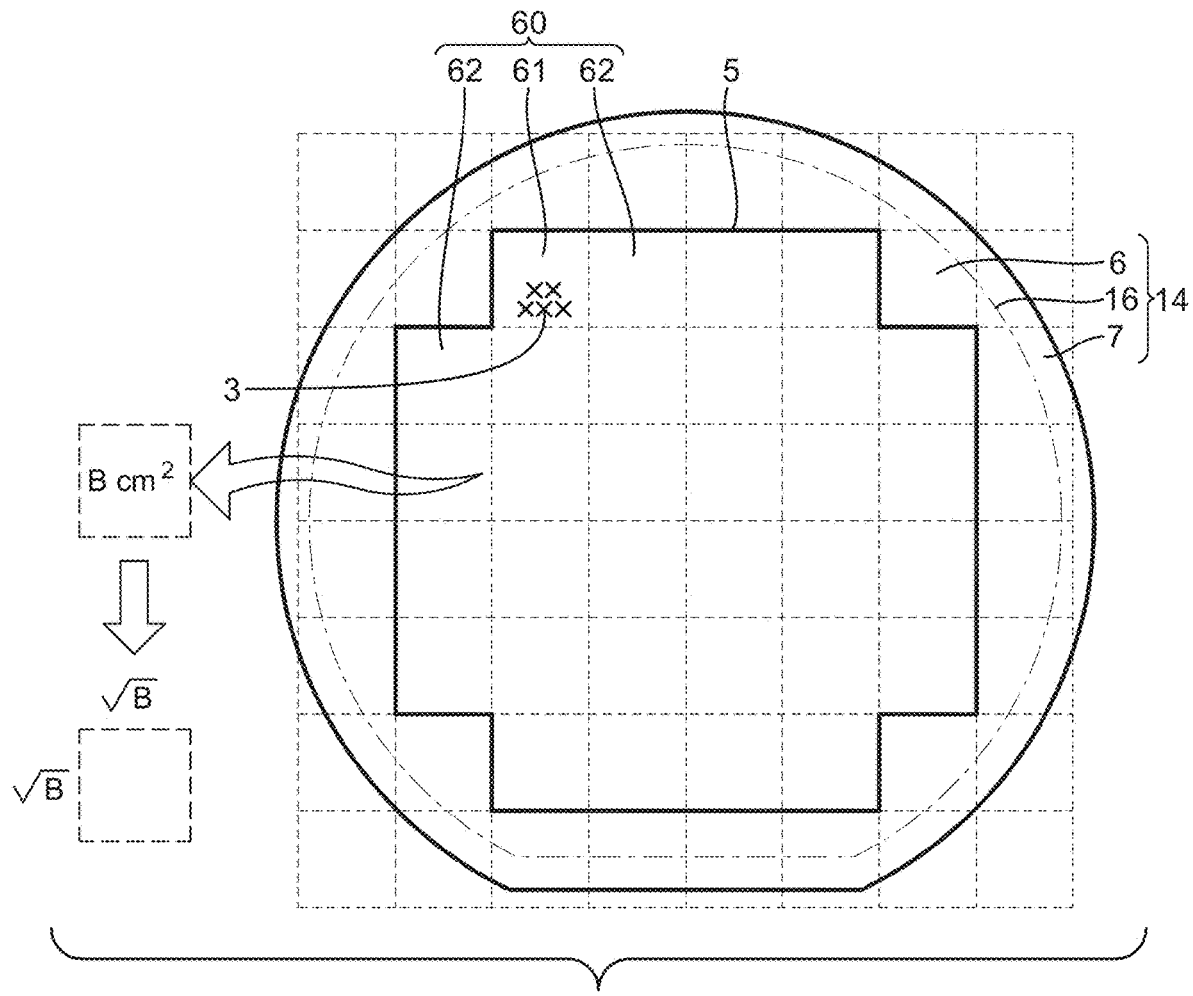
FIG. 12 is a schematic diagram showing a state in which the central region of the silicon carbide epitaxial substrate according to the present embodiment is divided into a plurality of second square regions.

Next, central region 6 is divided into a plurality of second square regions 60 each having an area of B $cm^2$. In FIG. 12, the minimum squares indicated by broken lines are second square regions 60. The plurality of second square regions 60 include: one or more third regions 61 having one or more macroscopic defects 3; and one or more fourth regions 62 not having one or more macroscopic defects 3. The length of each side of each second square region 60 having an area of B $cm^2$ is the square root of B. For example, the length of each side of a square region having an area of 0.25 $cm^2$ is 0.5 cm. A is smaller than B. B is less than or equal to 4. B may be less than or equal to 2, may be less than or equal to 0.5, or may be less than or equal to 0.25. A may be more than or equal to 0.01 or may be more than or equal to 0.04. B may be less than or equal to 4 and A may be more than or equal to 0.01. B may be less than or equal to 4 and A may be more than or equal to 0.04.

For example, as shown in FIG. 12, central region 6 of main front surface 14 is divided into 32 square regions. Among the 32 square regions, macroscopic defects 3 exist in one square region, and no macroscopic defects 3 exist in 31 square regions. The square region having macroscopic defects 3 existing therein is a third region 61. The square regions having no macroscopic defects 3 existing therein are fourth regions 62. The number of one or more third regions 61 is one. The number of one or more fourth regions 62 is 31. A second defect free area ratio is a value obtained by dividing the number (31) of one or more fourth regions 62 by the total (32) of the number (1) of one or more third regions 61 and the number (31) of one or more fourth regions 62. In this case, the second defect free area ratio is 31/32=96.9%. The value obtained by dividing the second defect free area ratio by the first defect free area ratio is 96.9%/98.6%=98.3%.

A value (defect density) obtained by dividing the number of macroscopic defects 3 by the area of central region 6 is X cm$^{-2}$, and X is more than 0 and less than 4. X may be less than 3.5, may be less than 3, or may be less than 2.5. Assuming that the area of central region 6 is, for example, 200 cm$^2$, the value obtained by dividing the number (5) of one or more macroscopic defects 3 by the area (200 cm$^2$) of central region 6 is 0.025/cm$^2$. A value obtained by dividing the second defect free area ratio by the first defect free area ratio satisfies Formula 1.

Next, the following describes a case where macroscopic defects 3 are not locally concentrated and are distributed over the whole of central region 6.

Figure 13:
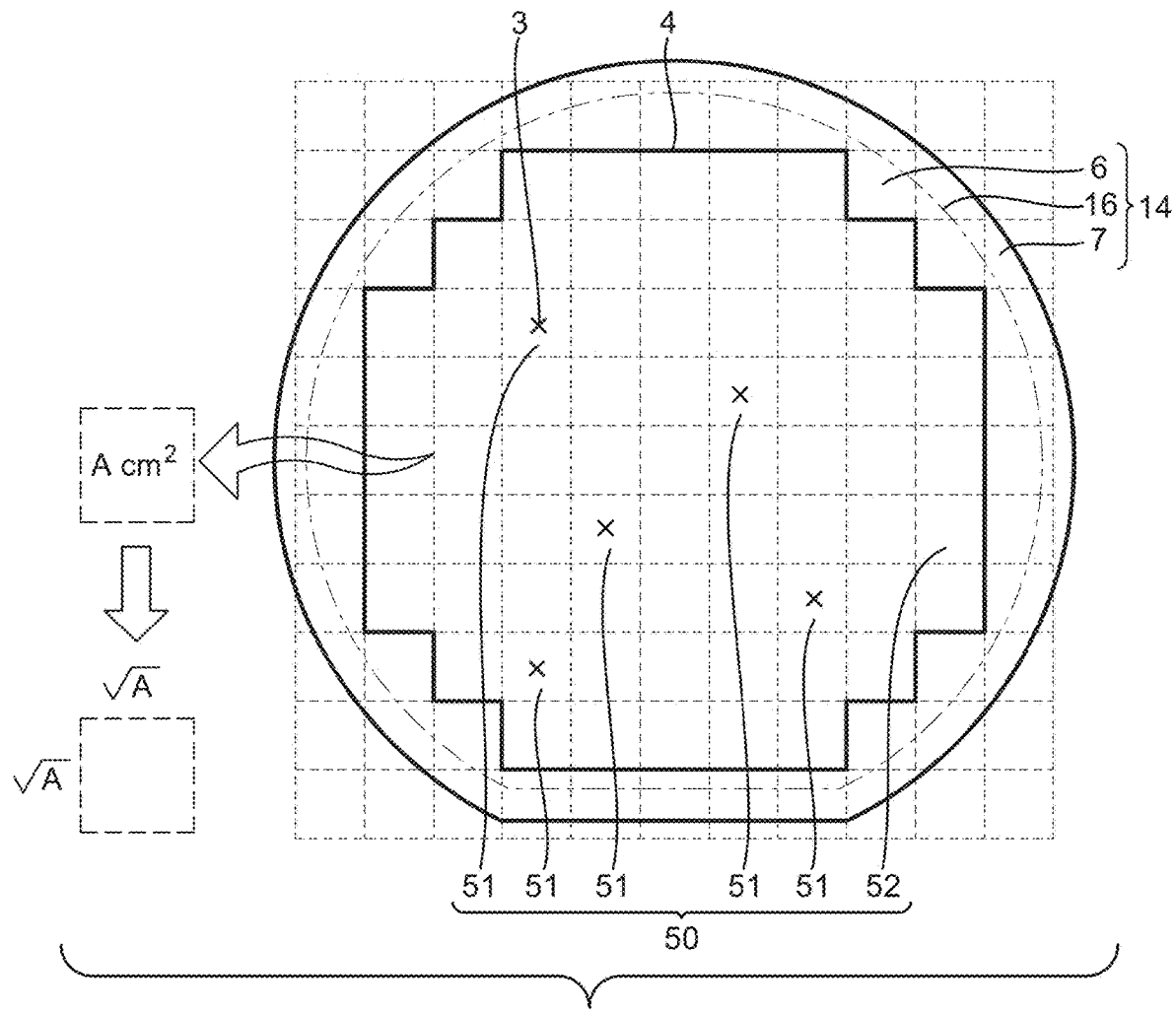
FIG. 13 is a schematic diagram showing a state in which a central region of a silicon carbide epitaxial substrate according to a comparative example is divided into a plurality of first square regions.

For example, as shown in FIG. 13, central region 6 of main front surface 14 is divided into 69 square regions. Among the 69 square regions, macroscopic defects 3 exist in five square regions, and no macroscopic defects 3 exist in 64 square regions. The square regions having macroscopic defects 3 existing therein are first regions 51. The square regions having no macroscopic defects 3 existing therein are second regions 52. The number of one or more first regions 51 is five. The number of one or more second regions 52 is 64. The first defect free area ratio is a value obtained by dividing the number (64) of one or more second regions 52 by the total (69) of the number (5) of one or more first regions 51 and the number (64) of one or more second regions 52. In this case, the first defect free area ratio is 68/69=92.8%.

Figure 14:
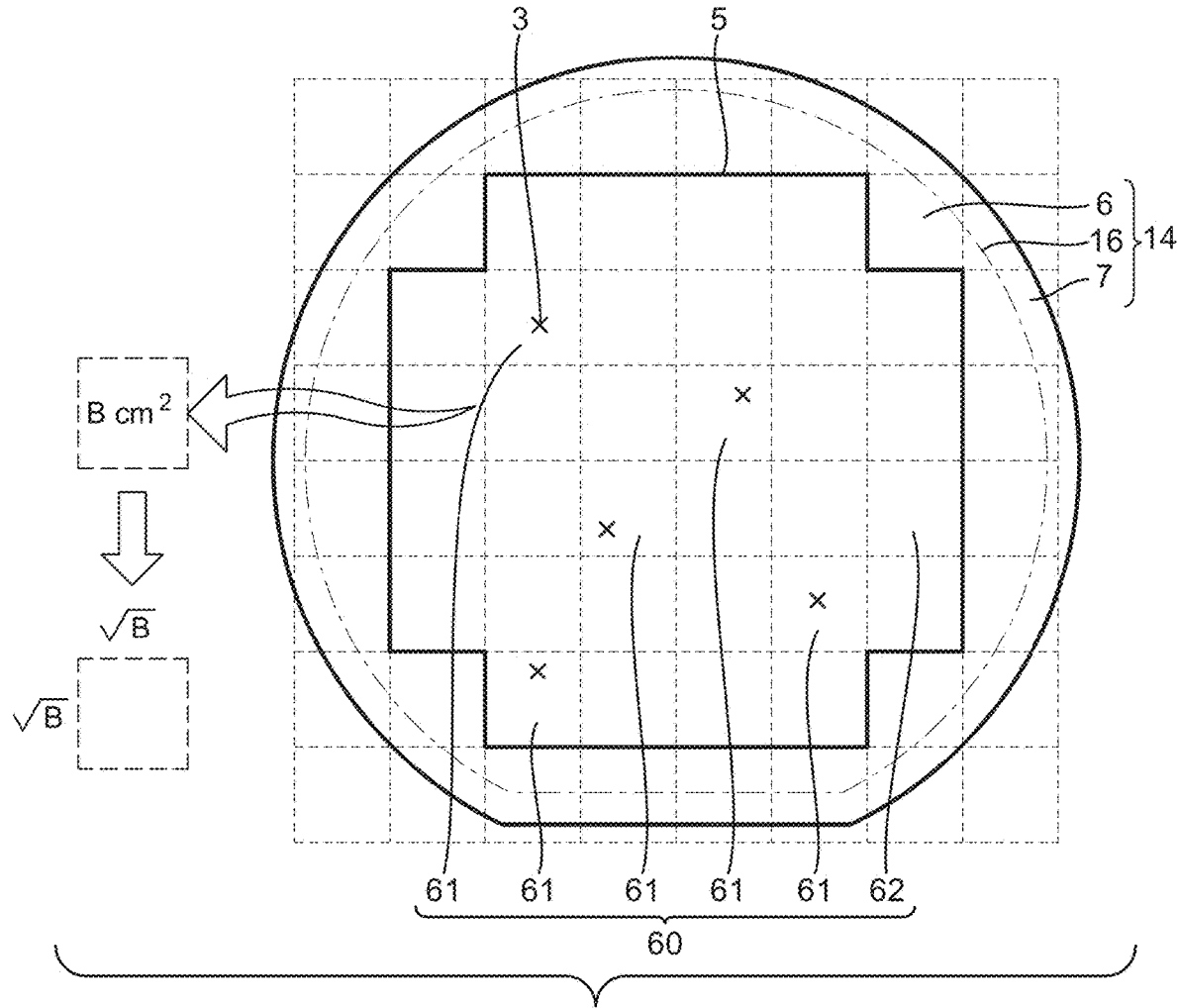
FIG. 14 is a schematic diagram showing a state in which the central region of the silicon carbide epitaxial substrate according to the comparative example is divided into a plurality of second square regions.

For example, as shown in FIG. 14, central region 6 of main front surface 14 is divided into 32 square regions. Among the 32 square regions, macroscopic defects 3 exist in five square regions, and no macroscopic defects 3 exist in 27 square regions. The square regions having macroscopic defects 3 existing therein are third regions 61. The square regions having no macroscopic defects 3 existing therein are fourth regions 62. The number of one or more third regions 61 is five. The number of one or more fourth regions 62 is 27. The second defect free area ratio is a value obtained by dividing the number (27) of one or more fourth regions 62 by the total (32) of the number (5) of one or more third regions 61 and the number (27) of one or more fourth regions 62. In this case, the second defect free area ratio is 27/32=84.4%. A value obtained by dividing the second defect free area ratio by the first defect free area ratio is 84.4%/92.8%=91.0%.

In the case where macroscopic defects 3 are randomly distributed, assuming that central region 6 is divided into the plurality of first square regions 50 each having an area of A cm$^2$ and the value obtained by dividing the number of macroscopic defects 3 by the area of central region 6 is X cm$^{-2}$, the first defect free area ratio (Y) is expressed by the following Formula 2:

$$Y = e^{-AX} \quad \text{(Formula 2)}$$

Similarly, in the case where macroscopic defects 3 are randomly distributed, assuming that central region 6 is divided into the plurality of second square regions 60 each having an area of B cm$^2$ and the value obtained by dividing the number of macroscopic defects 3 by the area of central region 6 is X cm$^{-2}$, the second defect free area ratio (Y) is expressed by the following Formula 3:

$$Y = e^{-BX} \quad \text{(Formula 3)}$$

In silicon carbide epitaxial substrate 100 according to the present embodiment, the value obtained by dividing the second defect free area ratio by the first defect free area ratio is larger than a value obtained by dividing Formula 3 by Formula 2. When macroscopic defects 3 are locally concentrated, the value obtained by dividing the second defect free area ratio by the first defect free area ratio becomes large. The value obtained by dividing the second defect free area ratio by the first defect free area ratio is preferably more than or equal to 1.1 times as large as the value obtained by dividing Formula 3 by Formula 2, and is more preferably more than or equal to 1.2 times as large as the value obtained by dividing Formula 3 by Formula 2. When A is 0.04 cm$^2$, the first defect free area ratio is preferably more than or equal to 95% and is more preferably more than or equal to 98%. When B is 0.25 cm$^2$, the second defect free area ratio is preferably more than or equal to 85% and is more preferably more than or equal to 90%.

It should be noted that when central region 6 is divided into a plurality of square regions, in the vicinity of the outer periphery of central region 6, there is a square region having a portion overlapping with a boundary 16 between central region 6 and outer peripheral region 7. Such a square region overlapping with boundary 16 is not taken into consideration in the calculations of the defect free area ratios. Specifically, in each of FIGS. 11 and 13, the defect free area ratio is calculated based on first square regions 50 in a region surrounded by a first polygon 4 indicated by a solid line in central region 6. First square regions 50 outside first polygon 4 are not used for the calculation of the defect free area ratio. Similarly, in each of FIGS. 12 and 14, the defect free area ratio is calculated based on second square regions 60 in a region surrounded by a second polygon 5 indicated by a solid line in central region 6. Second square regions 60 outside second polygon 5 are not used for the calculation of the defect free area ratio.

(Method for Measuring Macroscopic Defects)

Next, a method for measuring macroscopic defects 3 will be described. Each of macroscopic defects 3 can be specified using a defect inspection apparatus having a confocal differential interference microscope. As the defect inspection apparatus having a confocal differential interference microscope, WASAVI series "SICA 6X" provided by Lasertec can be used, for example. The magnification of an objective lens thereof is, for example, 10×. The threshold value of the detection sensitivity of the defect inspection apparatus is determined using a standard sample. Macroscopic defect 3 is defined in advance in consideration of typical dimension, polytype, and the like of macroscopic defect 3. Based on an observed image, the positions and number of defects satisfying the definition are specified. Specifically, when thickness 114 of silicon carbide epitaxial film 20 is represented by T and the tangent of off angle θ is represented by tan(θ), macroscopic defect 3 is defined as a defect that has a length 115 of more than or equal to 0.9×T/tan(θ) and less than or equal to 1.1×T/tan(θ) in the off direction (first direction 101) and that includes silicon carbide having a polytype different from that of the silicon carbide of silicon carbide epitaxial film 20.

(Manufacturing Apparatus for Silicon Carbide Epitaxial Substrate)

Next, a configuration of a manufacturing apparatus 200 for silicon carbide epitaxial substrate 100 according to the present embodiment will be described.

Figure 15:
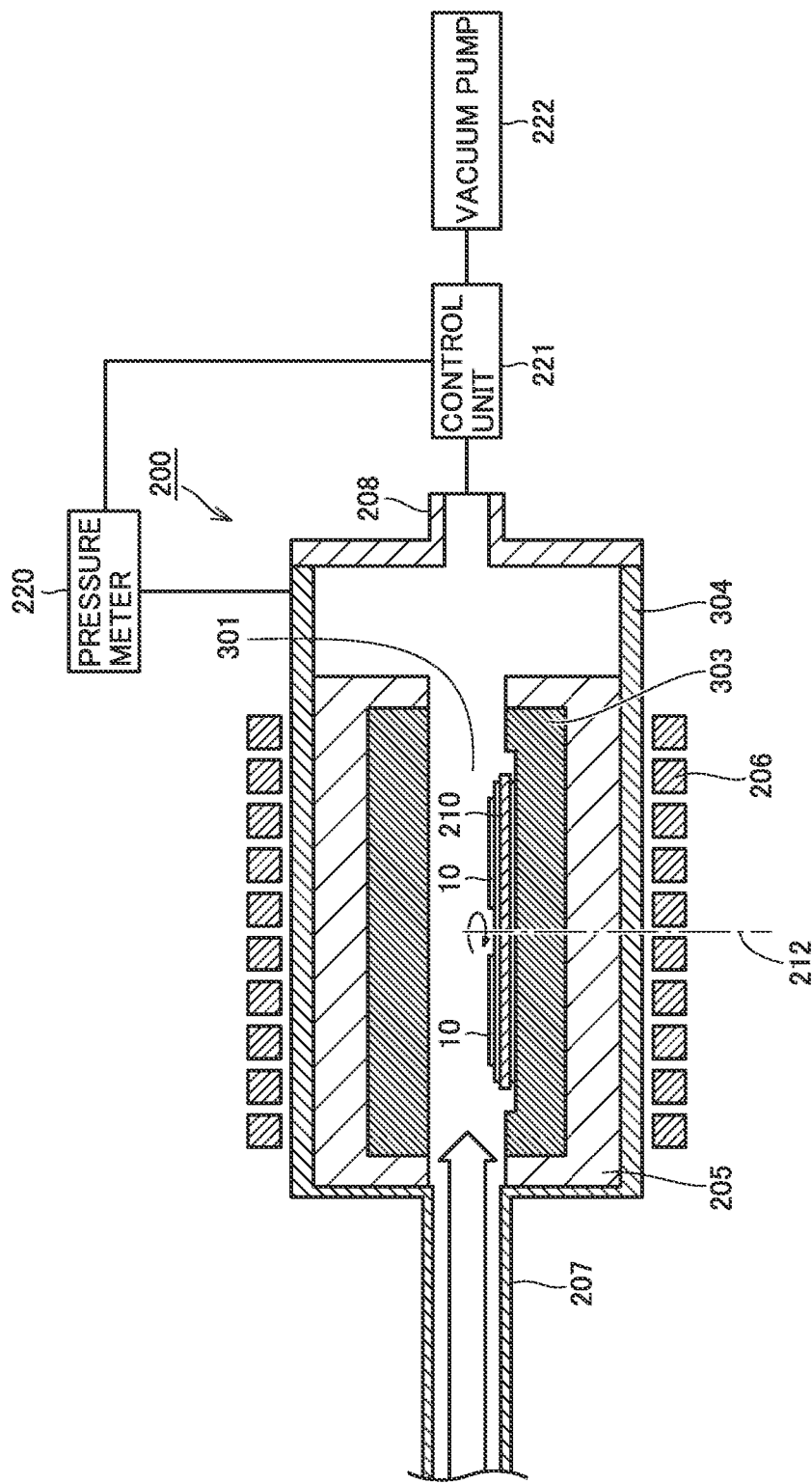
FIG. 15 is a schematic cross sectional view showing a configuration of a manufacturing apparatus for a silicon carbide epitaxial substrate according to the present embodiment.

As shown in FIG. 15, manufacturing apparatus 200 for silicon carbide epitaxial substrate 100 is, for example, a lateral type CVD (Chemical Vapor Deposition) apparatus in a hot wall method. Manufacturing apparatus 200 mainly includes a reaction chamber 301, a heating element 303, a quartz tube 304, a heat insulator 205, an induction heating coil 206, a gas inlet 207, a gas outlet 208, a pressure meter 220, a control unit 221, and a vacuum pump 222.

Heating element 303 has, for example, a cylindrical shape and has reaction chamber 301 formed therein. Heating element 303 is composed of, for example, graphite. Heat insulator 205 surrounds the outer periphery of heating element 303. Heat insulator 205 is provided inside quartz tube 304 in contact with the inner peripheral surface of quartz tube 304. Induction heating coil 206 is wound along the outer peripheral surface of quartz tube 304, for example. Induction heating coil 206 can be supplied with an alternating current by an external power supply (not shown). In this way, heating element 303 is inductively heated. As a result, reaction chamber 301 is heated by heating element 303.

Reaction chamber 301 is a space formed to be surrounded by heating element 303. Silicon carbide substrate 10 is disposed in reaction chamber 301. Reaction chamber 301 is configured to heat silicon carbide substrate 10. A susceptor 210 for holding silicon carbide substrate 10 is provided in reaction chamber 301. Susceptor 210 is rotatable about a rotation axis 212.

Gas outlet 208 is connected to vacuum pump 222. An arrow in FIG. 15 indicates a flow of gas. The gas is introduced from gas inlet 207 to reaction chamber 301, and is discharged from gas outlet 208. Pressure meter 220 is configured to measure a pressure inside reaction chamber 301. Control unit 221 is connected to pressure meter 220. Vacuum pump 222 is connected to control unit 221. Control unit 221 is configured to adjust a rate of flow from gas outlet 208 based on a value indicated by pressure meter 220. The pressure in reaction chamber 301 is adjusted using control unit 221.

Figure 16:
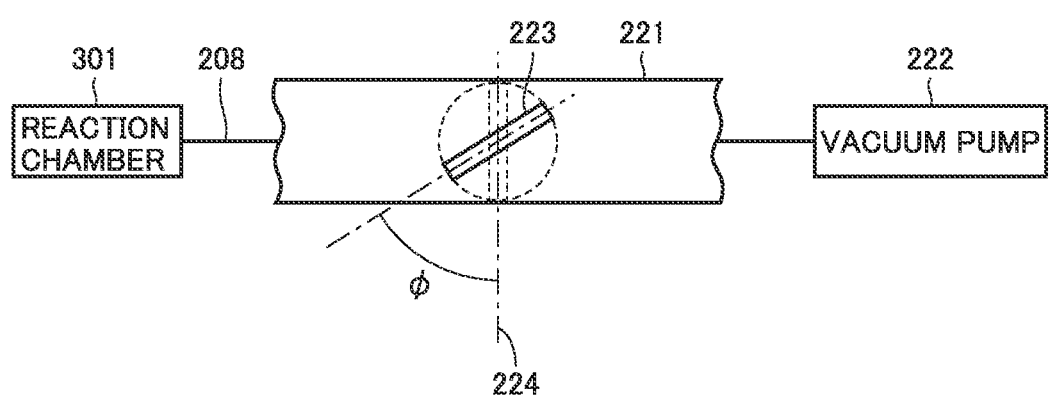
FIG. 16 is a schematic diagram showing an exemplary configuration of a control unit.

As shown in FIG. 16, control unit 221 includes, for example, a flow rate control valve 223. Before the discharging of the gas from reaction chamber 301, flow rate control valve 223 is placed in a direction (closing direction 224) perpendicular to the gas discharging direction. For example, a gas discharging rate can be adjusted by adjusting an angle $\phi$ of flow rate control valve 223 with respect to the closing direction.

Manufacturing apparatus 200 includes a gas supply unit (not shown) configured to supply reaction chamber 301 with a mixed gas including, for example, silane ($SiH_4$), propane ($C_3H_8$), ammonia ($NH_3$), and hydrogen ($H_2$). Specifically, the gas supply unit may include a gas cylinder for supplying propane gas, a gas cylinder for supplying hydrogen gas, a gas cylinder for supplying silane gas, and a gas cylinder for supplying ammonia gas. Manufacturing apparatus 200 may include a preheating unit (not shown) that can heat only the hydrogen gas, which is a carrier gas, before the supply thereof to reaction chamber 301.

(Method for Manufacturing Silicon Carbide Epitaxial Substrate)

Next, a method for manufacturing silicon carbide epitaxial substrate 100 according to the present embodiment will be described.

First, a step of preparing silicon carbide substrate 10 is performed. For example, a silicon carbide single crystal having a polytype of 4H is manufactured by a sublimation method. Next, the silicon carbide single crystal is sliced by, for example, a wire saw to prepare silicon carbide substrate 10. Silicon carbide substrate 10 includes an n type impurity such as nitrogen, for example. The conductivity type of silicon carbide substrate 10 is n type, for example.

Silicon carbide substrate 10 has first main surface 11 and second main surface 12 opposite to first main surface 11. First main surface 11 is, for example, a surface inclined in the off direction by an off angle $\theta 2$ with respect to the {0001} plane. Off angle $\theta 2$ is more than or equal to 2° and less than or equal to 6°. The off direction is, for example, the <11-20> direction. The maximum diameter of first main surface 11 of silicon carbide substrate 10 is, for example, more than or equal to 150 mm.

Next, a mechanical polishing step is performed. In the mechanical polishing step, mechanical polishing is performed onto first main surface 11 of silicon carbide substrate 10. Specifically, silicon carbide substrate 10 is held by a polishing head such that first main surface 11 faces a surface plate. Slurry including abrasive grains is supplied between the surface plate and first main surface 11. The abrasive grains are, for example, diamond abrasive grains. Second main surface 12 is also mechanically polished in the same manner as first main surface 11.

Next, a chemical mechanical polishing step is performed. In the chemical mechanical polishing step, chemical mechanical polishing is performed onto first main surface 11 of silicon carbide substrate 10. Specifically, silicon carbide substrate 10 is held by a polishing head such that first main surface 11 faces a surface plate. Slurry including abrasive grains is supplied between the surface plate and first main surface 11. The abrasive grains are, for example, diamond abrasive grains. The slurry includes, for example, a hydrogen peroxide solution (oxidizing agent). Second main surface 12 is also chemically and mechanically polished in the same manner as first main surface 11.

Next, a step of discharging gas from reaction chamber 301 is performed. First, as shown in FIG. 15, silicon carbide substrate 10 is disposed on susceptor 210. Next, the gas is discharged from reaction chamber 301. The gas discharging rate in reaction chamber 301 is adjusted by control unit 221. Before the discharging of the gas from reaction chamber 301, flow rate control valve 223 is placed in the direction (closing direction 224) perpendicular to the gas discharging direction. As shown in FIG. 16, the gas discharging rate can be adjusted by adjusting angle $\phi$ of flow rate control valve 223 with respect to the closing direction.

Figure 17:
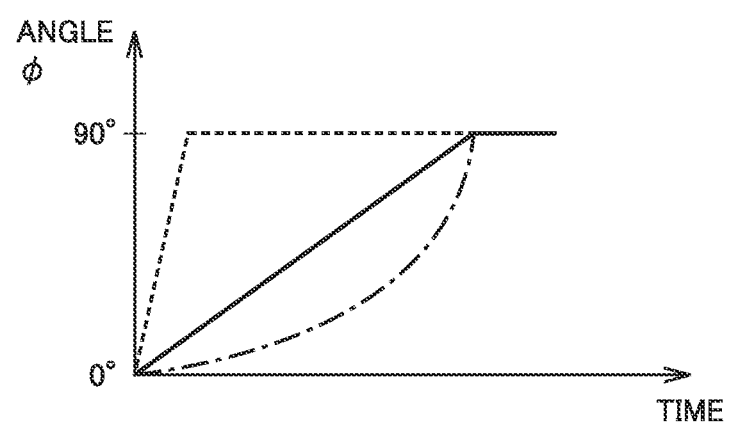
FIG. 17 is a diagram showing a first example of a relation between a time and an angle of a pressure control valve of the control unit.
Figure 18:
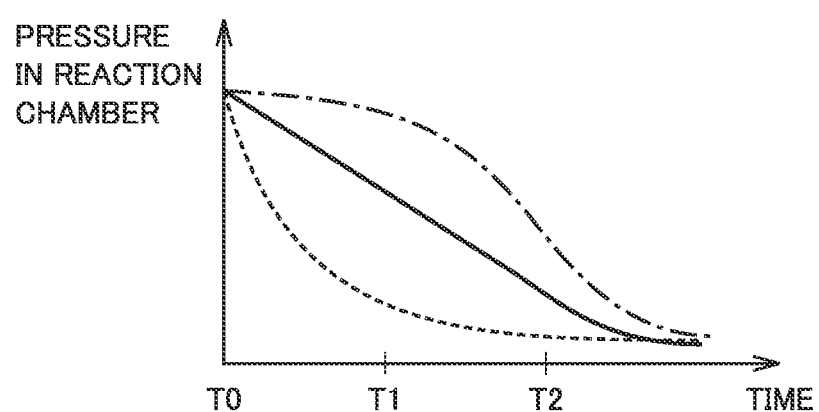
FIG. 18 is a diagram showing a relation between a time and a pressure in a reaction chamber.

As indicated by a broken line in each of FIGS. 17 and 18, when angle of flow rate control valve 223 with respect to the closing direction is abruptly increased, the pressure in reaction chamber 301 is abruptly reduced. On the other hand, as indicated by a solid line and an alternate long and short dash line in each of FIGS. 17 and 18, when angle $\phi$ of flow rate control valve 223 with respect to the closing direction is gradually increased, the pressure in reaction chamber 301 is gradually reduced. When the pressure in reaction chamber 301 is abruptly reduced, fine particles on the heating element are facilitated to fall over a wide range on silicon carbide substrate 10. The fine particles cause macroscopic defects 3. In the method for manufacturing silicon carbide epitaxial substrate 100 according to the present embodiment, the pressure in reaction chamber 301 is gradually reduced. Accordingly, fine particles on the heating element can be suppressed from falling over a wide range on silicon carbide substrate 10. As a result, macroscopic defects 3 can be suppressed from being formed over the wide range on the silicon carbide epitaxial substrate.

Specifically, a pressure reduction rate in one minute from the time point of start of pressure reduction is adjusted to less than or equal to 300 mbar/min. The pressure reduction rate in one minute from the time point of start of pressure reduction is preferably adjusted to less than or equal to 100 mbar/min, and is more preferably adjusted to less than or equal to 50 mbar/min. It should be noted that 1 mbar equals to 100 Pa.

Figure 19:
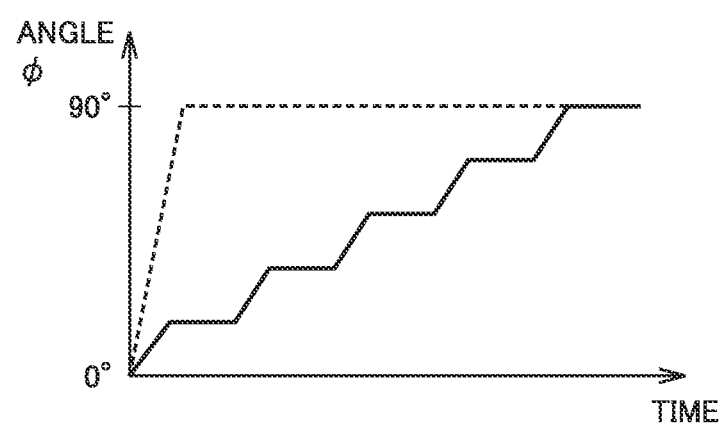
FIG. 19 is a diagram showing a second example of the relation between the time and the angle of the pressure control valve of the control unit.

As indicated by the alternate long and short dash line in FIG. 18, the pressure reduction rate in a period of time from the time point (time point T0) of start of pressure reduction to a time point T1 may be smaller than the pressure reduction rate in a period of time from time point T1 to a time point T2. As indicated by the solid line in FIG. 18, the pressure reduction rate in the period of time from the time point (time point T0) of start of pressure reduction to time point T1 may be substantially the same as the pressure reduction rate in the period of time from time point T1 to time point T2. It should be noted that the period of time from the time point (time point T0) of start of pressure reduction to time point T1 is as long as the period of time from time point T1 to time point T2. The period of time from time point T0 to time point T1 is, for example, 2 minutes. As indicated by a solid line in FIG. 19, the pressure in reaction chamber 301 may be adjusted by stepwisely changing angle ϕ of flow rate control valve 223 with respect to closing direction 224.

Next, a mixed gas including silane, propane, ammonia, and hydrogen is introduced into reaction chamber 301 with the temperature of reaction chamber 301 being increased to, for example, about 1630° C. Specifically, the flow rate of the silane gas is adjusted to be 115 sccm, for example. The flow rate of the propane gas is adjusted to be 57.6 sccm, for example. The flow rate of the ammonia gas is adjusted to be $2.5 \times 10^{-2}$ sccm, for example. The flow rate of the hydrogen gas is adjusted to 100 slm. The mixed gas flows along a direction of arrow 106 in a region facing first main surface 11 of silicon carbide substrate 10. By introducing the mixed gas into reaction chamber 301, silicon carbide epitaxial film 20 is formed by epitaxial growth on first main surface 11 of silicon carbide substrate 10 (see FIG. 2).

(Method for Manufacturing Silicon Carbide Semiconductor Device)

Next, a method for manufacturing a silicon carbide semiconductor device 300 according to the present embodiment will be described.

Figure 20:
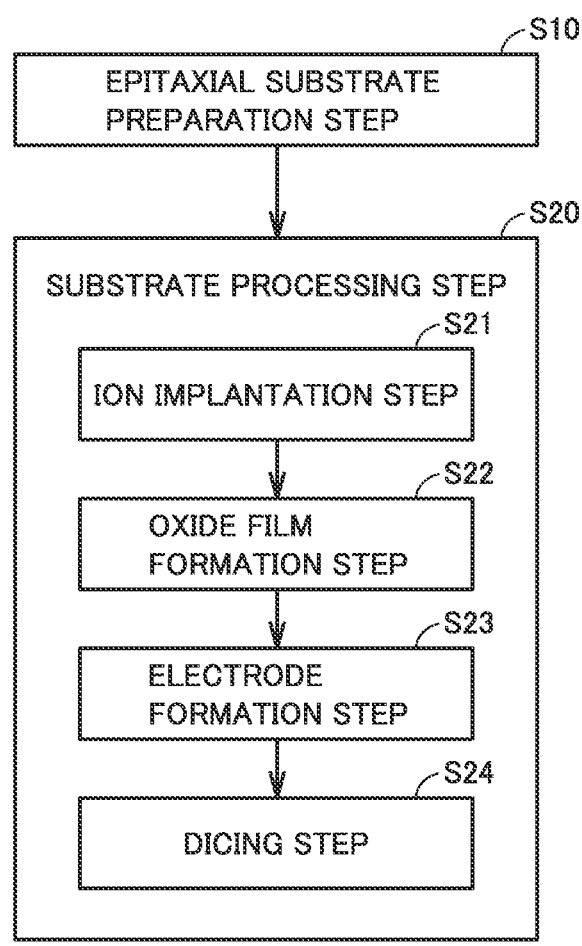
FIG. 20 is a flowchart schematically showing a method for manufacturing a silicon carbide semiconductor device according to the present embodiment.

The method for manufacturing the silicon carbide semiconductor device according to the present embodiment mainly includes an epitaxial substrate preparation step (S10: FIG. 20) and a substrate processing step (S20: FIG. 20).

First, the epitaxial substrate preparation step (S10: FIG. 20) is performed. Specifically, silicon carbide epitaxial substrate 100 is prepared by the above-described method for manufacturing silicon carbide epitaxial substrate 100 (see FIG. 1).

Next, the substrate processing step (S20: FIG. 20) is performed. Specifically, silicon carbide epitaxial substrate 100 is processed to manufacture a silicon carbide semiconductor device. The "processing" includes, for example, various types of processing such as ion implantation, heat treatment, etching, oxide film formation, electrode formation, and dicing. That is, the substrate processing step may include at least one of the ion implantation, the heat treatment, the etching, the oxide film formation, the electrode formation, and the dicing.

The following describes a method for manufacturing a MOSFET (Metal Oxide Semiconductor Field Effect Transistor) serving as an exemplary silicon carbide semiconductor device. The substrate processing step (S20: FIG. 20) includes, for example, an ion implantation step (S21: FIG. 20), an oxide film formation step (S22: FIG. 20), an electrode formation step (S23: FIG. 20), and a dicing step (S24: FIG. 20).

Figure 21:
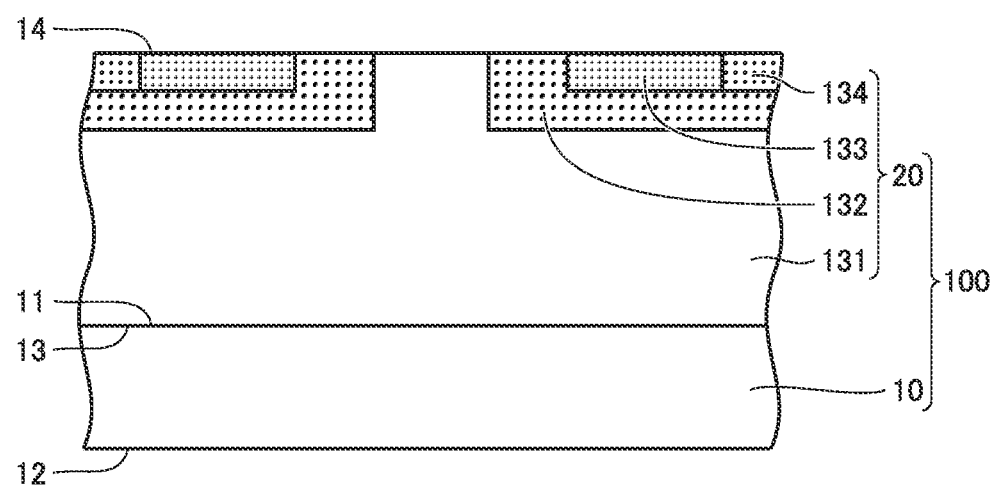
FIG. 21 is a schematic cross sectional view showing a first step of the method for manufacturing the silicon carbide semiconductor device according to the present embodiment.

First, the ion implantation step (S21: FIG. 20) is performed. A p type impurity such as aluminum (Al) is implanted into main front surface 14 on which a mask (not shown) provided with an opening is formed. Accordingly, a body region 132 having p type conductivity is formed. Next, an n type impurity such as phosphorus (P) is implanted into a predetermined position in body region 132. Accordingly, a source region 133 having n type conductivity is formed. Next, a p type impurity such as aluminum is implanted into a predetermined position in source region 133. Accordingly, a contact region 134 having p type conductivity is formed (see FIG. 21).

In silicon carbide epitaxial film 20, a portion other than body region 132, source region 133, and contact region 134 serves as a drift region 131. Source region 133 is separated from drift region 131 by body region 132. The ion implantation may be performed with silicon carbide epitaxial substrate 100 being heated to about more than or equal to 300° C. and less than or equal to 600° C. After the ion implantation, activation annealing is performed onto silicon carbide epitaxial substrate 100. By the activation annealing, the impurities implanted in silicon carbide epitaxial film 20 are activated, thereby generating carriers in each region. An atmosphere for the activation annealing is, for example, an argon (Ar) atmosphere. A temperature in the activation annealing is, for example, about 1800° C. A time for the activation annealing is, for example, about 30 minutes.

Figure 22:
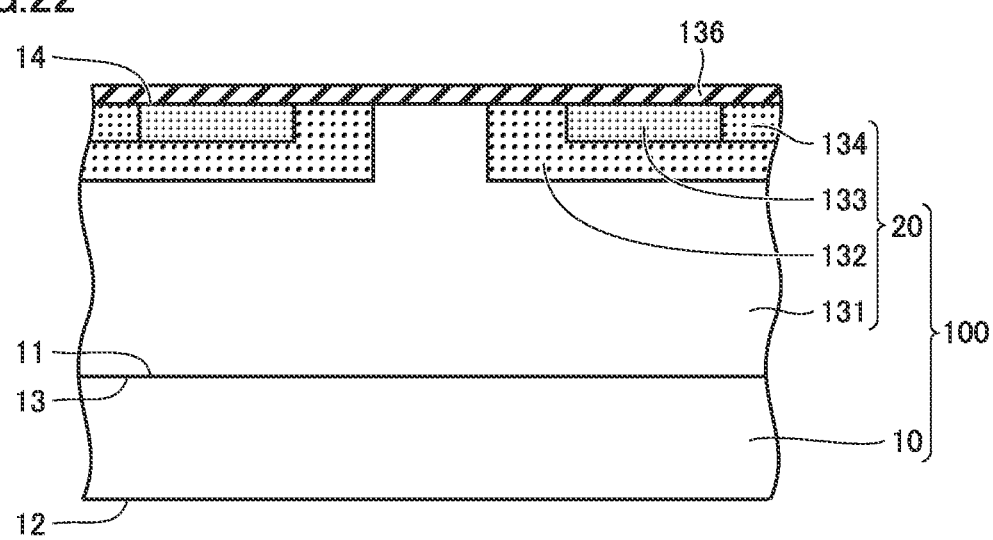
FIG. 22 is a schematic cross sectional view showing a second step of the method for manufacturing a silicon carbide semiconductor device according to the present embodiment.

Next, the oxide film formation step (S22: FIG. 20) is performed. For example, an oxide film 136 is formed on main front surface 14 by heating silicon carbide epitaxial substrate 100 in an atmosphere including oxygen (see FIG. 22). Oxide film 136 is composed of, for example, silicon dioxide. Oxide film 136 serves as a gate insulating film. A temperature in the thermal oxidation treatment is, for example, about 1300° C. A time for the thermal oxidation treatment is, for example, about 30 minutes.

After oxide film 136 is formed, heat treatment may be further performed in a nitrogen atmosphere. For example, heat treatment is performed in a nitrogen monoxide atmosphere at about 1100° C. for about 1 hour. Thereafter, heat treatment is further performed in an argon atmosphere. For example, the heat treatment is performed in the argon atmosphere at about more than or equal to 1100° C. and less than or equal to 1500° C. for about 1 hour.

Next, the electrode formation step (S23: FIG. 20) is performed. Specifically, a gate electrode 141 is formed on oxide film 136. Gate electrode 141 is formed by, for example, a CVD (Chemical Vapor Deposition) method. Gate electrode 141 is composed of, for example, polysilicon having electric conductivity, or the like. Gate electrode 141 is formed at a position facing source region 133 and body region 132.

Next, an interlayer insulating film 137 covering gate electrode 141 is formed. Interlayer insulating film 137 is formed by, for example, the CVD method. Interlayer insulating film 137 is composed of, for example, silicon dioxide or the like. Interlayer insulating film 137 is formed in contact with gate electrode 141 and oxide film 136. Next, portions of oxide film 136 and interlayer insulating film 137 are removed by etching. Accordingly, source region 133 and contact region 134 are exposed through oxide film 136.

Next, a source electrode 142 is formed on the exposed portion by a sputtering method, for example. Source electrode 142 is composed of, for example, titanium, aluminum, silicon, or the like. After source electrode 142 is formed, source electrode 142 and silicon carbide epitaxial substrate 100 are heated at a temperature of, for example, about more than or equal to 900° C. and less than or equal to 1100° C. Accordingly, source electrode 142 and silicon carbide epitaxial substrate 100 are brought into ohmic contact with each other. Next, a wiring layer 138 is formed in contact with source electrode 142. Wiring layer 138 is composed of, for example, a material including aluminum. Next, a drain electrode 143 is formed on second main surface 12. Drain electrode 143 is composed of, for example, an alloy including nickel and silicon (for example, NiSi or the like).

Figure 23:
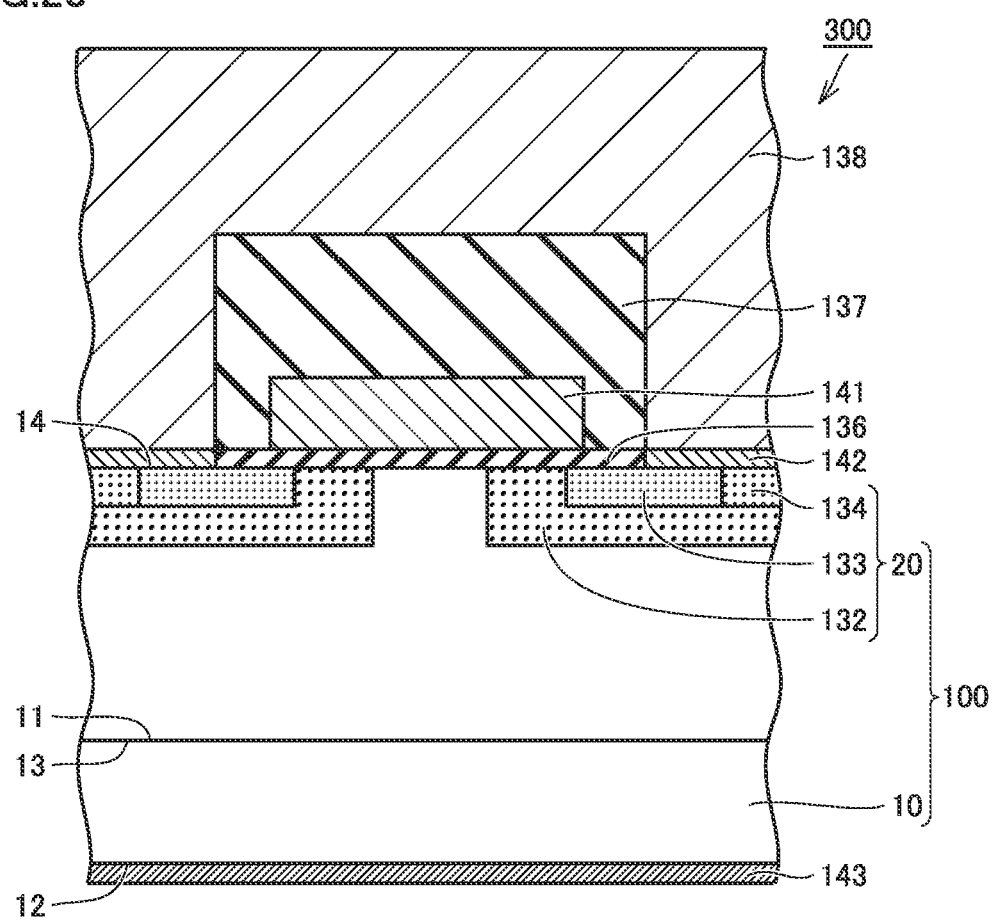
FIG. 23 is a schematic cross sectional view showing a configuration of a silicon carbide semiconductor device according to the present embodiment.

Next, a dicing step (S24: FIG. 20) is performed. For example, dicing is performed along a dicing line to split silicon carbide epitaxial substrate 100 into a plurality of semiconductor chips. Accordingly, silicon carbide semiconductor device 300 is manufactured (see FIG. 23).

Although the method for manufacturing the silicon carbide semiconductor device according to the present disclosure has been described above by illustrating the planar type MOSFET, the manufacturing method according to the present disclosure is not limited thereto. The manufacturing method according to the present disclosure is applicable to silicon carbide semiconductor devices such as a trench type MOSFET, an IGBT (Insulated Gate Bipolar Transistor), a SBD (Schottky Barrier Diode), a thyristor, a GTO (Gate Turn Off Tyristor), and a PN diode, for example.

Next, the following describes functions and effects of silicon carbide epitaxial substrate 100 and the method for manufacturing silicon carbide semiconductor device 300 according to the present embodiment.

In silicon carbide epitaxial substrate 100 according to the present embodiment, when central region 6 is divided into the plurality of first square regions 50 each having an area of A cm$^2$, the plurality of first square regions 50 have one or more first regions 51 having one or more macroscopic defects 3 and one or more second regions 52 not having one or more macroscopic defects 3. When central region 6 is divided into a plurality of second square regions 60 each having an area of B cm$^2$, the plurality of second square regions 60 have one or more third regions 61 having one or more macroscopic defects 3 and one or more fourth regions 62 not having one or more macroscopic defects 3. When the value obtained by dividing the number of one or more second regions 52 by the total of the number of one or more first regions 51 and the number of one or more second regions 52 is defined as the first defect free area ratio, the value obtained by dividing the number of one or more fourth regions 62 by the total of the number of one or more third regions 61 and the number of one or more fourth regions 62 is defined as the second defect free area ratio, and the value obtained by dividing the number of one or more macroscopic defects 3 by the area of central region 6 is defined as X cm$^{-2}$, A is smaller than B, B is less than or equal to 4, X is more than 0 and less than 4, and Formula 1 is satisfied. Accordingly, even when the area density of macroscopic defects 3 is high to some extent, macroscopic defects 3 are locally concentrated in part of the chips on central region 6, whereby a large number of chips having no macroscopic defects 3 existing therein can be secured. As a result, a yield of silicon carbide semiconductor devices can be improved.

EXAMPLES (Preparation of Samples)

First, silicon carbide epitaxial substrates 100 according to samples 1 and 2 were prepared. Silicon carbide epitaxial substrate 100 according to sample 1 was a comparative example. Silicon carbide epitaxial substrate 100 according to sample 2 was an example of the present disclosure. The silicon carbide epitaxial substrates according to samples 1 and 2 were manufactured in accordance with the above-described method for manufacturing silicon carbide epitaxial substrate 100, except for the following conditions.

Figure 24:
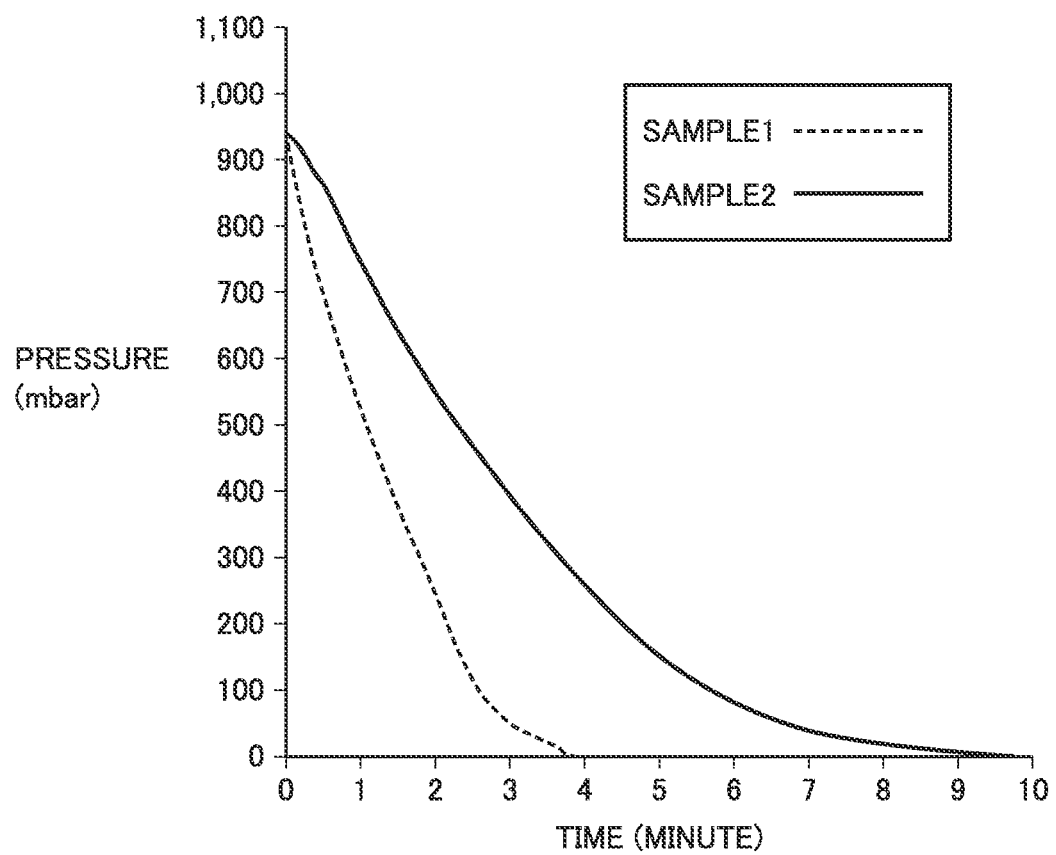
FIG. 24 is a diagram showing a relation between a time and a pressure in a reaction chamber with regard to each of samples 1 and 2.

The respective methods for manufacturing silicon carbide epitaxial substrates according to samples 1 and 2 were different from each other in terms of a pressure changing profile in reaction chamber 301 in the step of discharging the gas from the reaction chamber. As shown in FIG. 24, in the method for manufacturing the silicon carbide epitaxial substrate according to sample 1, the pressure in reaction chamber 301 was abruptly reduced. Specifically, the pressure in reaction chamber 301 was reduced from about 930 mbar to 100 mbar in a period of time of about two and a half minutes. On the other hand, in the method for manufacturing the silicon carbide epitaxial substrate according to sample 2, the pressure in reaction chamber 301 was gradually reduced. Specifically, the pressure in reaction chamber 301 was reduced from about 930 mbar to 100 mbar in a period of time of about 6 minutes.

(Evaluation Method)

Figure 25:
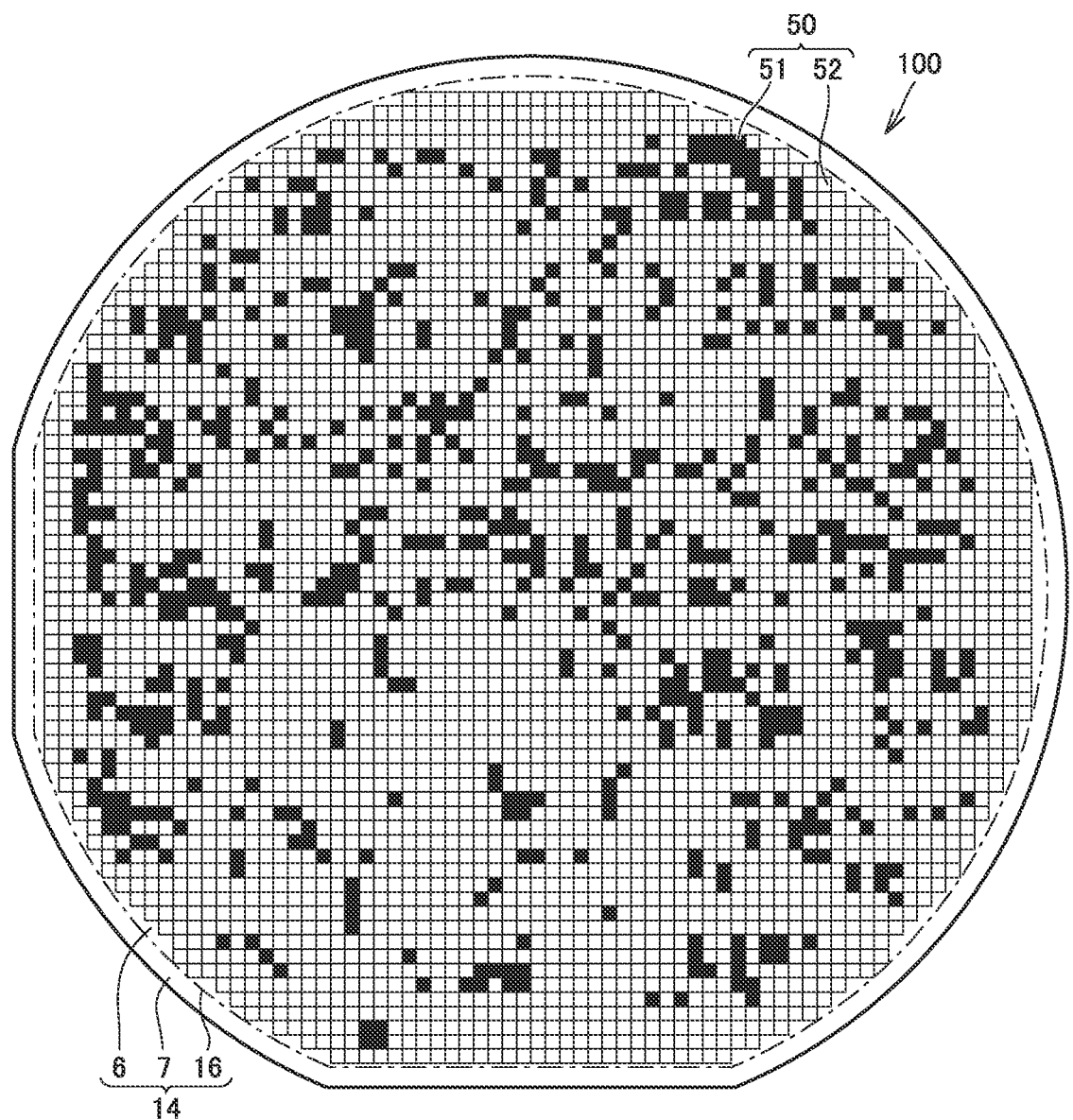
FIG. 25 is a diagram showing a state in which a central region of a silicon carbide epitaxial substrate according to sample 1 is divided into a plurality of first square regions each having each side of 2 mm.
Figure 26:
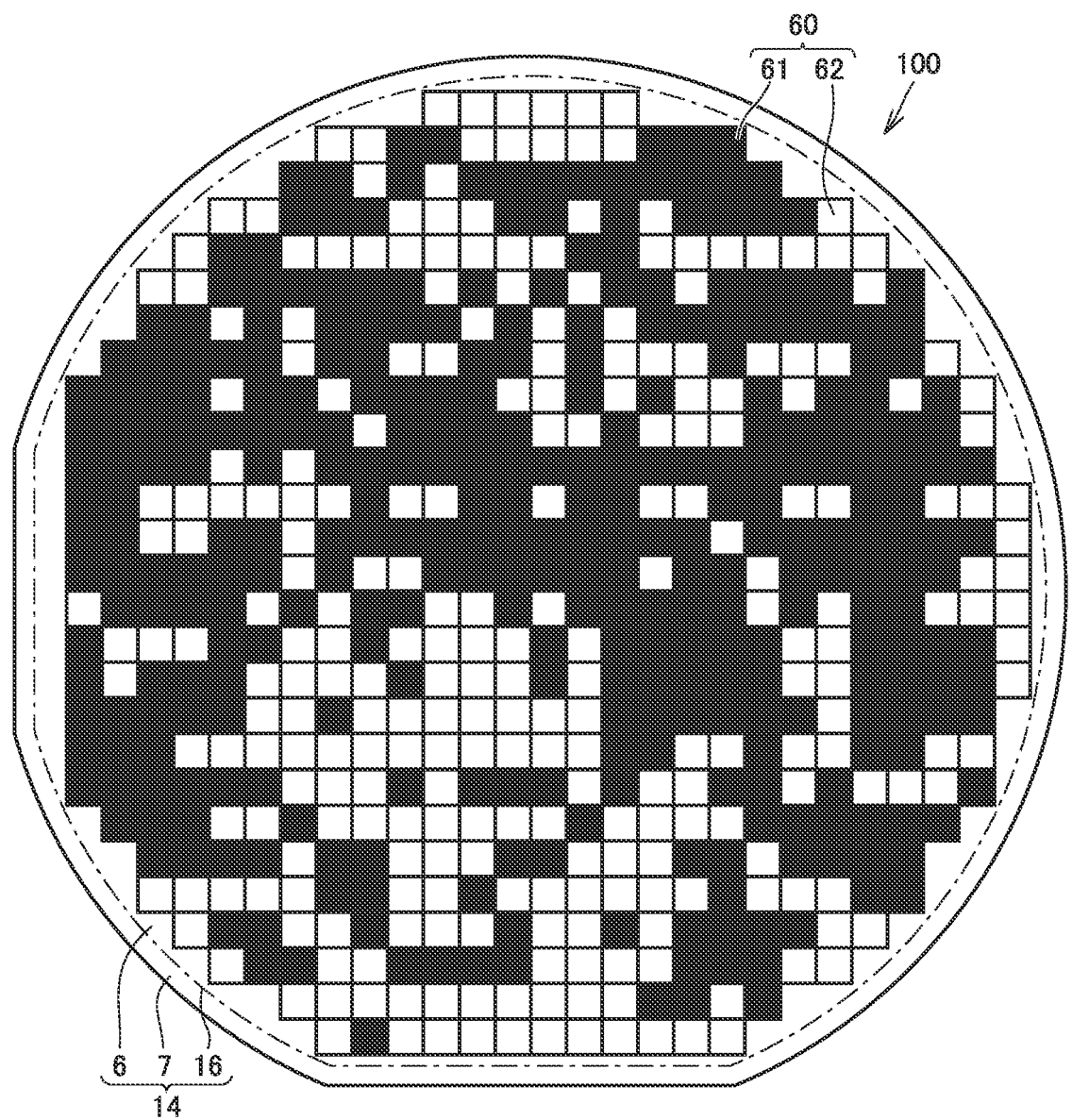
FIG. 26 is a diagram showing a state in which the central region of the silicon carbide epitaxial substrate according to sample 1 is divided into a plurality of second square regions each having each side of 5 mm.

Next, macroscopic defects 3 were observed in main front surface 14 of each of silicon carbide epitaxial substrates 100 according to samples 1 and 2. FIG. 25 is a diagram showing a state in which central region 6 of the silicon carbide epitaxial substrate according to sample 1 is divided into a plurality of first square regions 50 each having each side of 2 mm. FIG. 26 is a diagram showing a state in which central region 6 of the silicon carbide epitaxial substrate according to sample 1 is divided into a plurality of second square regions 60 each having each side of 5 mm. In FIG. 25, each of regions in black represents a first square region (first region 51) having a macroscopic defect 3 existing therein. In FIG. 26, each of regions in black represents a second square region (third region 61) having a macroscopic defect 3 existing therein. As shown in FIGS. 25 and 26, in central region 6 of the silicon carbide epitaxial substrate according to sample 1, macroscopic defects 3 are widely distributed.

Figure 27:
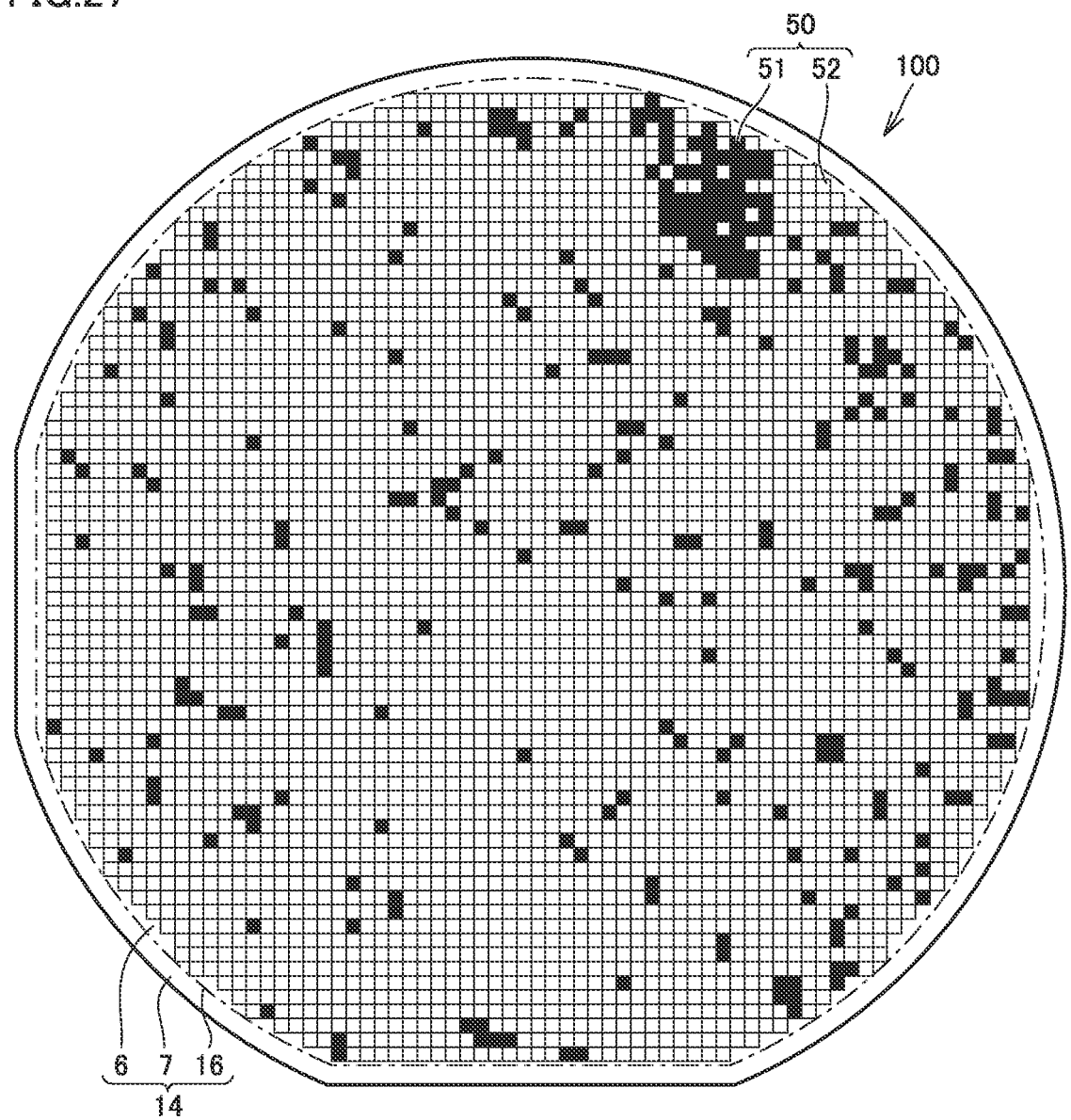
FIG. 27 is a diagram showing a state in which a central region of a silicon carbide epitaxial substrate according to sample 2 is divided into a plurality of first square regions each having each side of 2 mm.
Figure 28:
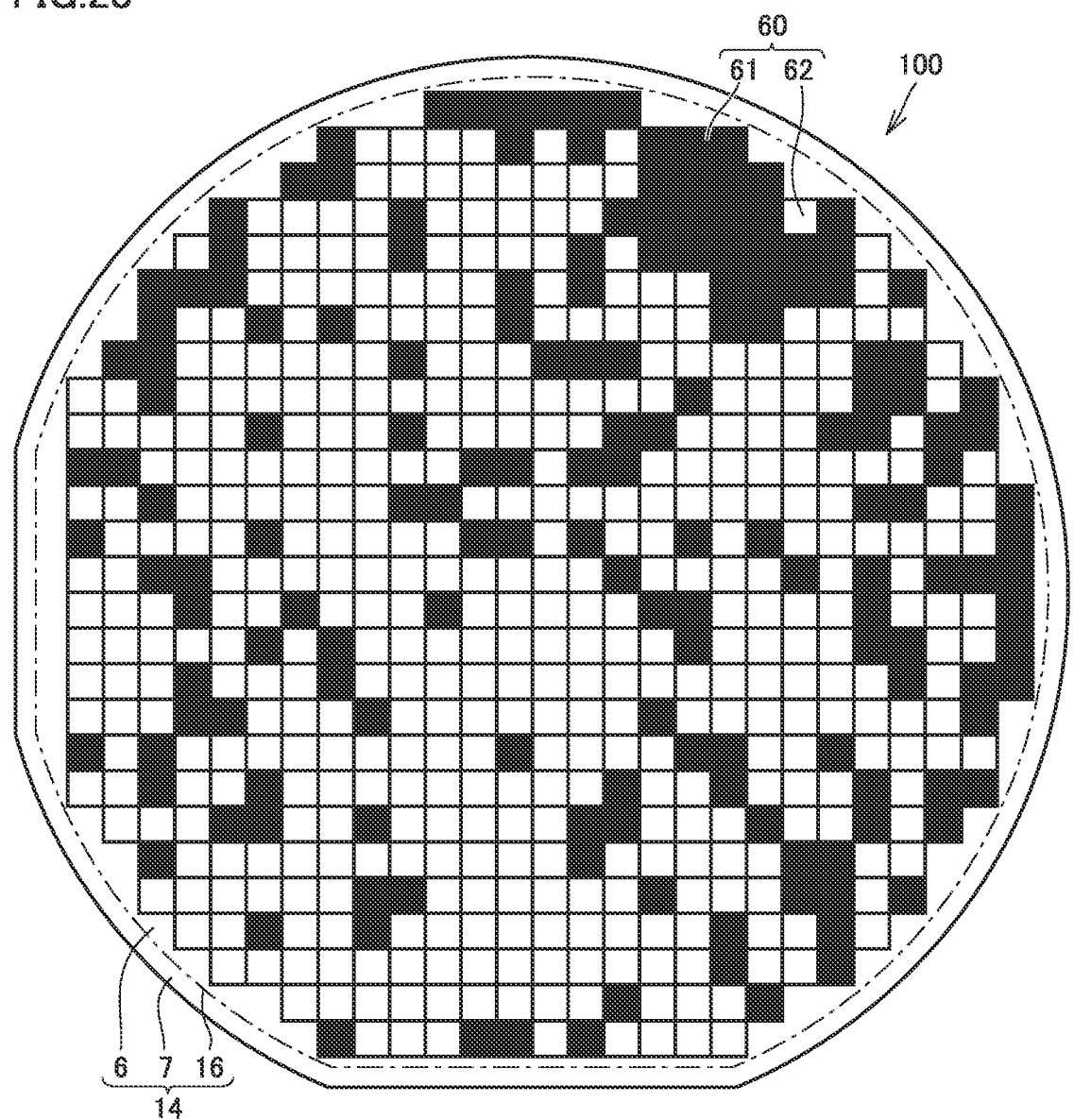
FIG. 28 is a diagram showing a state in which the central region of the silicon carbide epitaxial substrate according to sample 2 is divided into a plurality of second square regions each having each side of 5 mm.

FIG. 27 is a diagram showing a state in which central region 6 of the silicon carbide epitaxial substrate according to sample 2 is divided into a plurality of first square regions 50 each having each side of 2 mm. FIG. 28 is a diagram showing a state in which central region 6 of the silicon carbide epitaxial substrate according to sample 2 is divided into a plurality of second square regions 60 each having each side of 5 mm. In FIG. 27, each of regions in black represents a first square region (first region 51) having a macroscopic defect 3 existing therein. In FIG. 28, each of regions in black represents a second square region (third region 61) having a macroscopic defect 3 existing therein. As shown in FIGS. 27 and 28, in central region 6 of the silicon carbide epitaxial substrate according to sample 2, macroscopic defects 3 are locally concentrated. Specifically, as shown in FIG. 27, macroscopic defects 3 are concentrated at the upper right of central region 6.

(Evaluation Results)

TABLE 1

| Sample No. | Defect Density [cm$^{-2}$] | Length of Each Side of Square Region | Defect Free Area Ratio (DFA) | DFA (5.0 mm)/ DFA (2.0 mm) |
|---|---|---|---|---|
| Sample 1 | 4.4 | 2.0 mm | 84.9% | 52.7% |
|  |  | 5.0 mm | 44.7% |  |
| Sample 2 | 2.2 | 2.0 mm | 91.9% | 77.3% |
|  |  | 5.0 mm | 71.5% |  |

As shown in Table 1, a value (defect density) obtained by dividing the number of macroscopic defects 3 in central region 6 of the silicon carbide epitaxial substrate according to sample 1 by the area of central region 6 was 4.4 cm². When central region 6 of the silicon carbide epitaxial substrate according to sample 1 was divided into the plurality of first square regions 50 each having each side of 2 mm, the defect free area ratio (first defect free area ratio) was 84.9%. When central region 6 of the silicon carbide epitaxial substrate according to sample 1 was divided into the plurality of second square regions 60 each having each side of 5 mm, the defect free area ratio (second defect free area ratio) was 44.7%. A value obtained by dividing the second defect free area ratio by the first defect free area ratio was 52.7%.

A value (defect density) obtained by dividing the number of macroscopic defects 3 in central region 6 of the silicon carbide epitaxial substrate according to sample 2 by the area of central region 6 was 2.2 cm⁻². When central region 6 of the silicon carbide epitaxial substrate according to sample 2 was divided into the plurality of first square regions 50 each having each side of 2 mm, the defect free area ratio (first defect free area ratio) was 91.9%. When central region 6 of the silicon carbide epitaxial substrate according to sample 2 was divided into the plurality of second square regions 60 each having each side of 5 mm, the defect free area ratio (second defect free area ratio) was 71.5%. A value obtained by dividing the second defect free area ratio by the first defect free area ratio was 77.8%. As described above, by reducing the pressure changing rate in the step of discharging the gas from the reaction chamber, the silicon carbide epitaxial substrate could be obtained in which the value obtained by dividing the second defect free area ratio by the first defect free area ratio is high.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: starting point; 3: macroscopic defect; 4: first polygon; 5: second polygon; 6: central region; 7: outer peripheral region; 10: silicon carbide substrate; 11: first main surface; 12: second main surface; 13: third main surface; 14: main front surface; 15: recess; 16: boundary; 17: orientation flat; 18: arc-shaped portion; 19: outer edge; 20: silicon carbide epitaxial film; 21: first epitaxial film; 22: second epitaxial film; 31: first side portion; 32: second side portion; 33: second portion; 34: first portion; 35: side portion; 36: inclination portion; 41: third portion; 42: fourth portion; 50: first square region; 51: first region; 52: second region; 60: second square region; 61: third region; 62: fourth region; 71: first defect region; 72: second defect region; 73: third defect region; 74: fourth defect region; 75: fifth defect region; 81: third side portion; 82: fourth side portion; 83: fifth side portion; 84: sixth side portion; 85: seventh side portion; 86: eighth side portion; 87: ninth side portion; 88: tenth side portion; 100: silicon carbide epitaxial substrate; 101: first direction; 102: second direction; 103: third direction; 104: fourth direction; 105: fifth direction; 106: arrow; 111: maximum diameter; 112: distance; 114: thickness; 115: length; 116: first thickness; 117: second thickness; 131: drift region; 132: body region; 133: source region; 134: contact region; 136: oxide film; 137: interlayer insulating film; 138: wiring layer; 141: gate electrode; 142: source electrode; 143: drain electrode; 200: manufacturing apparatus; 205: heat insulator; 206: induction heating coil; 207: gas inlet; 208: gas outlet; 210: susceptor; 212: rotation shaft; 220: pressure meter; 221: control unit; 222: vacuum pump; 223: flow rate control valve; 224: closing direction; 300: silicon carbide semiconductor device; 301: reaction chamber; 303: heating element; 304: quartz tube; T0, T1, T2: time point.

The invention claimed is:

1. A silicon carbide epitaxial substrate comprising:
a silicon carbide substrate; and
a silicon carbide epitaxial film located on the silicon carbide substrate, wherein
a main front surface of the silicon carbide epitaxial film includes an outer edge, an outer peripheral region located within 3 mm from the outer edge, and a central region surrounded by the outer peripheral region,
a maximum diameter of the main front surface is more than or equal to 150 mm,
the central region has one or more macroscopic defects,
wherein when the central region is divided into a plurality of first square regions each having an area of A cm², the plurality of first square regions have one or more first regions having the one or more macroscopic defects and one or more second regions not having the one or more macroscopic defects,
wherein when the central region is divided into a plurality of second square regions each having an area of B cm², the plurality of second square regions have one or more third regions having the one or more macroscopic defects and one or more fourth regions not having the one or more macroscopic defects,
wherein when a value obtained by dividing the number of the one or more second regions by a total of the number of the one or more first regions and the number of the one or more second regions is defined as a first defect free area ratio, a value obtained by dividing the number of the one or more fourth regions by a total of the number of the one or more third regions and the number of the one or more fourth regions is defined as a second defect free area ratio, and a value obtained by dividing the number of the one or more macroscopic defects by an area of the central region is defined as X cm⁻², A is smaller than B, B is less than or equal to 4, X is more than 0 and less than 4, and a Formula 1 is satisfied:

$$e^{(A-B)X} < \frac{\text{Second Defect Free Area Ratio}}{\text{First Defect Free Area Ratio}} < 1, \quad \text{(Formula 1)}$$

wherein when Formula 1 is satisfied the macroscopic defects are more locally concentrated than when Formula 1 is not satisfied.

2. The silicon carbide epitaxial substrate according to claim 1, wherein B is less than or equal to 2.

3. The silicon carbide epitaxial substrate according to claim 1, wherein B is less than or equal to 0.5.

4. The silicon carbide epitaxial substrate according to claim 1, wherein B is less than or equal to 0.25.

5. The silicon carbide epitaxial substrate according to claim 1, wherein A is more than or equal to 0.01.

6. The silicon carbide epitaxial substrate according to claim 1, wherein A is more than or equal to 0.04.

7. The silicon carbide epitaxial substrate according to claim 1, wherein A is 0.04 and B is 0.25.

8. The silicon carbide epitaxial substrate according to claim 1, wherein a polytype of silicon carbide of each of the silicon carbide substrate and the silicon carbide epitaxial film is 4H.

9. The silicon carbide epitaxial substrate according to claim 1, wherein each of the silicon carbide substrate and the silicon carbide epitaxial film includes an n type impurity.

10. A method for manufacturing a silicon carbide semiconductor device, the method comprising:
preparing the silicon carbide epitaxial substrate recited in claim 1; and
processing the silicon carbide epitaxial substrate.

11. A silicon carbide epitaxial substrate comprising:
a silicon carbide substrate; and
a silicon carbide epitaxial film located on the silicon carbide substrate, wherein
a polytype of silicon carbide of each of the silicon carbide substrate and the silicon carbide epitaxial film is 4H,
each of the silicon carbide substrate and the silicon carbide epitaxial film includes an n type impurity,
a main front surface of the silicon carbide epitaxial film includes an outer edge, an outer peripheral region located within 3 mm from the outer edge, and a central region surrounded by the outer peripheral region,
a maximum diameter of the main front surface is more than or equal to 150 mm,
the central region has one or more macroscopic defects,
wherein when the central region is divided into a plurality of first square regions each having an area of A cm$^2$, the plurality of first square regions have one or more first regions having the one or more macroscopic defects and one or more second regions not having the one or more macroscopic defects,
wherein when the central region is divided into a plurality of second square regions each having an area of B cm$^2$, the plurality of second square regions have one or more third regions having the one or more macroscopic defects and one or more fourth regions not having the one or more macroscopic defects,
wherein when a value obtained by dividing the number of the one or more second regions by a total of the number of the one or more first regions and the number of the one or more second regions is defined as a first defect free area ratio, a value obtained by dividing the number of the one or more fourth regions by a total of the number of the one or more third regions and the number of the one or more fourth regions is defined as a second defect free area ratio, and a value obtained by dividing the number of the one or more macroscopic defects by an area of the central region is defined as X cm$^{-2}$, A is 0.04, B is 0.25, X is more than 0 and less than 4, and a Formula 1 is satisfied:

$$e^{(A \cdot B)X} < \frac{\text{Second Defect Free Area Ratio}}{\text{First Defect Free Area Ratio}} < 1, \quad \text{(Formula 1)}$$

wherein when Formula 1 is satisfied the macroscopic defects are more locally concentrated than when Formula 1 is not satisfied.

* * * * *